(12) United States Patent
Shin et al.

(10) Patent No.: US 12,156,424 B2
(45) Date of Patent: Nov. 26, 2024

(54) DISPLAY PANEL, DISPLAY DEVICE INCLUDING THE SAME, AND MANUFACTURING METHOD THEREOF

(71) Applicant: LG Display Co., Ltd., Seoul (KR)

(72) Inventors: Sanghak Shin, Goyang-si (KR); Hoon Kang, Goyang-si (KR); Soonhwan Hong, Goyang-si (KR); Youngmin Kim, Goyang-si (KR); Changsoo Kim, Paju-si (KR); Inhyuk Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 562 days.

(21) Appl. No.: 17/563,108

(22) Filed: Dec. 28, 2021

(65) Prior Publication Data

US 2022/0399529 A1 Dec. 15, 2022

(30) Foreign Application Priority Data

Jun. 9, 2021 (KR) ........................ 10-2021-0074649

(51) Int. Cl.
*H10K 50/858* (2023.01)
*G09G 3/3275* (2016.01)
(Continued)

(52) U.S. Cl.
CPC ......... *H10K 50/858* (2023.02); *G09G 3/3275* (2013.01); *H10K 50/865* (2023.02);
(Continued)

(58) Field of Classification Search
CPC ............... H10K 50/858; H10K 50/865; H10K 59/1213; H10K 59/353; H10K 59/121;
(Continued)

(56) References Cited

U.S. PATENT DOCUMENTS

| | | | |
|---|---|---|---|
| 11,108,023 B2 | 8/2021 | Sim et al. | |
| 2015/0048333 A1* | 2/2015 | Choi | H10K 50/858 |
| | | | 257/40 |
| 2021/0193763 A1 | 6/2021 | Sun et al. | |

FOREIGN PATENT DOCUMENTS

| | | |
|---|---|---|
| CN | 110600518 A | 12/2019 |
| CN | 111223904 A | 6/2020 |

(Continued)

OTHER PUBLICATIONS

Extended European Search Report dated Aug. 6, 2022, issued in corresponding European Patent 21215293.8-1211.

*Primary Examiner* — Amare Mengistu
*Assistant Examiner* — Gloryvid Figueroa-Gibson
(74) *Attorney, Agent, or Firm* — Morgan, Lewis & Bockius LLP

(57) ABSTRACT

Disclosed are a display panel in which a unit pixel is divided into a wide-angle area and a narrow-angle area in which at least sub-pixel is disposed and light emission is individually and selectively performed, a display device including the same, and a manufacturing method thereof. A semi-cylindrical lens is disposed in the wide-angle area so as to cover a plurality of sub-pixels. Semi-spherical lenses are disposed in the narrow-angle area so as to cover sub-pixels respectively. Therefore, a direction of light emitting from a light-emitting layer is controlled by adjusting a refractive index of each of the lenses in the wide-angle area and the narrow-angle area. Thus, a viewing angle is controlled.

22 Claims, 11 Drawing Sheets

(51) Int. Cl.
*H10K 50/86* (2023.01)
*H10K 59/121* (2023.01)
*H10K 59/35* (2023.01)

(52) U.S. Cl.
CPC ....... *H10K 59/1213* (2023.02); *H10K 59/353* (2023.02); *G09G 2310/0272* (2013.01); *G09G 2310/08* (2013.01)

(58) Field of Classification Search
CPC .... H10K 59/879; H10K 59/35; H10K 59/126; H10K 59/80515; H10K 59/8792; H10K 59/123; G09G 3/3275; G09G 2310/0272; G09G 2310/08; G09G 2230/00; G09G 2300/0417; G09G 2300/0452; G09G 2300/0804; G09G 2300/0842; G09G 2300/0895; G09G 2310/0216; G09G 2320/028; G09G 3/3258; G09G 2320/068; G09G 2300/0426; G09G 2358/00; G09G 3/3225; G09G 3/3266; H01L 27/1214
USPC .......................................................... 345/32
See application file for complete search history.

(56) References Cited

FOREIGN PATENT DOCUMENTS

| | | |
|---|---|---|
| JP | 2011065773 A | 3/2011 |
| KR | 10-1661206 B1 | 9/2016 |
| KR | 10-2020-0002103 A | 1/2020 |

\* cited by examiner

DISPLAY PANEL, DISPLAY DEVICE INCLUDING THE SAME, AND MANUFACTURING METHOD THEREOF

CROSS-REFERENCE TO RELATED APPLICATION

This application claims a benefit under 35 U.S.C. § 119(a) of Korean Patent Application No. 10-2021-0074649 filed on Jun. 9, 2021, on the Korean Intellectual Property Office, the entirety of disclosure of which is incorporated herein by reference for all purposes.

BACKGROUND

Technical Field

The present disclosure relates to a display panel in which a unit pixel is divided into a wide-angle area and a narrow-angle area from which a color is individually output, a display device including the same, and a manufacturing method thereof.

Discussion of the Related Art

A flat panel display (FPD) includes an organic light emitting diode (OLED) display device which has high luminance and low operation voltage properties.

Because the OLED display device is self-luminous, a contrast ratio thereof is large, and the OLED display device is manufactured into an ultra-thin display. Further, the OLED display device has a response time of several microseconds, which makes it easy to implement a moving image. the OLED display device has no viewing angle limitation, is stable even at low temperatures, and operates at a low voltage of DC 5 to 15V, thereby making it easy to manufacture and design a driver circuit.

Further, because a manufacturing process of the OLED display device is mainly composed of deposition and encapsulation, the manufacturing process is very simple.

A plurality of thin-film transistors such as a switching thin-film transistor, a driving thin-film transistor, and a sensing thin-film transistor are formed in each pixel area of the OLED display device.

SUMMARY

However, in the OLED display device, a significant portion of light emitting from an organic light-emitting layer thereof may be lost while passing through various components of the display device and emitting to an outside. Thus, the light emitting to the outside of the OLED display device is only about 50% or smaller of the light emitting from the organic light-emitting layer.

In this connection, an amount of light emitting from the organic light-emitting layer increases as a magnitude of the current applied to the OLED display device increases. Thus, luminance of the OLED display device may be enhanced by applying a larger amount of current to the organic light-emitting layer. However, this may increase power consumption. In addition, a lifespan of the OLED display device is also reduced.

Recently, in order to control a light path of the OLED display device, a light control film (LCF) is attached to an outer face of a substrate of the OLED display device.

The light control film (LCF) may control an amount of light transmitting therethrough using a louver structure disposed on a top face of a polarizing plate (POL) based on a pitch and a vertical dimension of the louver structure. Further, the light control film (LCF) may block light at a certain angle or larger using the Louver structure. For example, the light control film (LCF) may block light incident to the panel at 60 degrees or larger.

Another scheme for controlling the light path may include a SPM film which may applying an electrical signal to a liquid crystal injection layer disposed on a top face of the polarizing plate (POL) to block the light. Dispersion stability of injected liquid of the SPM film should be secured using liquid phase related schemes. Further, the liquid is very vulnerable to temperature, and thus the SPM film may not operate at low or high temperatures.

The above-described light control film (LCF) or SPM film causes decrease in luminance as the barrier layer is added as described above.

Accordingly, embodiments of the present disclosure are directed to a display panel, a display device including the same, and a manufacturing method thereof that substantially obviate one or more of the problems due to limitations and disadvantages of the related art.

To solve the above-described problems in the OLED display device, the inventors of the present disclosure have invented a display panel in which a unit pixel is divided into a wide-angle area and a narrow-angle area in which sub-pixels are arranged, and the sub-pixels in the wide-angle area and the sub-pixels in the narrow-angle area are selectively activated.

Further, the inventors of the present disclosure have invented a display panel in which a unit pixel is divided into a wide-angle area and a narrow-angle area in which sub-pixels of the unit pixel are arranged, and a color of the sub-pixels in the wide-angle area is output through a semi-cylindrical lens or a color of the sub-pixels in the narrow-angle area is output through a semi-spherical lens, according to the user's choice when viewing the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

A display panel according to one embodiment of the present disclosure may be provided. In the display panel, a unit pixel may be divided into a wide-angle area and a narrow-angle area in which at least one sub-pixel is arranged. A semi-cylindrical first lens may be disposed in the wide-angle area. A semi-spherical second lens may be disposed in the narrow-angle area.

Further, a display device according to one embodiment of the present disclosure may be displayed. A unit pixel may be divided into a wide-angle area and a narrow-angle area in which at least one sub-pixel is arranged. A gate driver of the display device applies a gate signal to the at least one sub-pixel through at least one gate line under control of a timing controller. A data driver thereof applies a data signal to the at least one sub-pixel through at least one data line under control of the timing controller.

According to an embodiment of the present disclosure, the unit pixel may be divided into the wide-angle area and the narrow-angle area. the plurality of pixels arranged in the light-emitting area may be arranged in the wide-angle area and the narrow-angle area and may be activated therein in a separate manner. Thus, a light-emitting angle of the pixels in the unit pixel may be selected, thereby controlling the viewing angle.

Further, according to an embodiment of the present disclosure, the refractive indices of the layers are similar to each other, and refractive indices of the lenses and outermost layers may be different from each other by an amount to control a direction of light.

Further, according to an embodiment of the present disclosure, a direction of light emitting from the light-emitting layer may be controlled by adjusting a refractive index of each of the lenses in the wide-angle area and the narrow-angle area. Thus, a viewing angle may be adjusted based on the controlled light direction.

Further, according to the present disclosure, a viewing angle may be controlled based on a refractive index of each of the layers in the pixels within a unit pixel. A physical light control layer may be associated with pixel operation inside the panel to control the viewing angle.

Further, according to the present disclosure, a display mode of the display device may be selectively implemented as a privacy mode required for the display device (mobile device, IT device, and auto-oriented display).

Further, the present disclosure may improve optical efficiency without loss of optical loss as there are no additional layers.

Further, the present disclosure may increase a lifetime and realize high luminance of the display device by improvement of light efficiency.

Further, according to the present disclosure, one compensation pixel in the wide-angle area may be divided into two light emitting units using the lenses.

Further, the present disclosure may realize prevention of upward light leakage as required for privacy or LCF (Light Control Film) during operation of the pixels in the narrow-angle area.

Further, according to an embodiment of the present disclosure, a film present in a conventional film attached display device may be removed, thereby increasing brightness and improve light condensation efficiency using the lens. Thus, the lifespan of the display device products may be expected to be improved.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
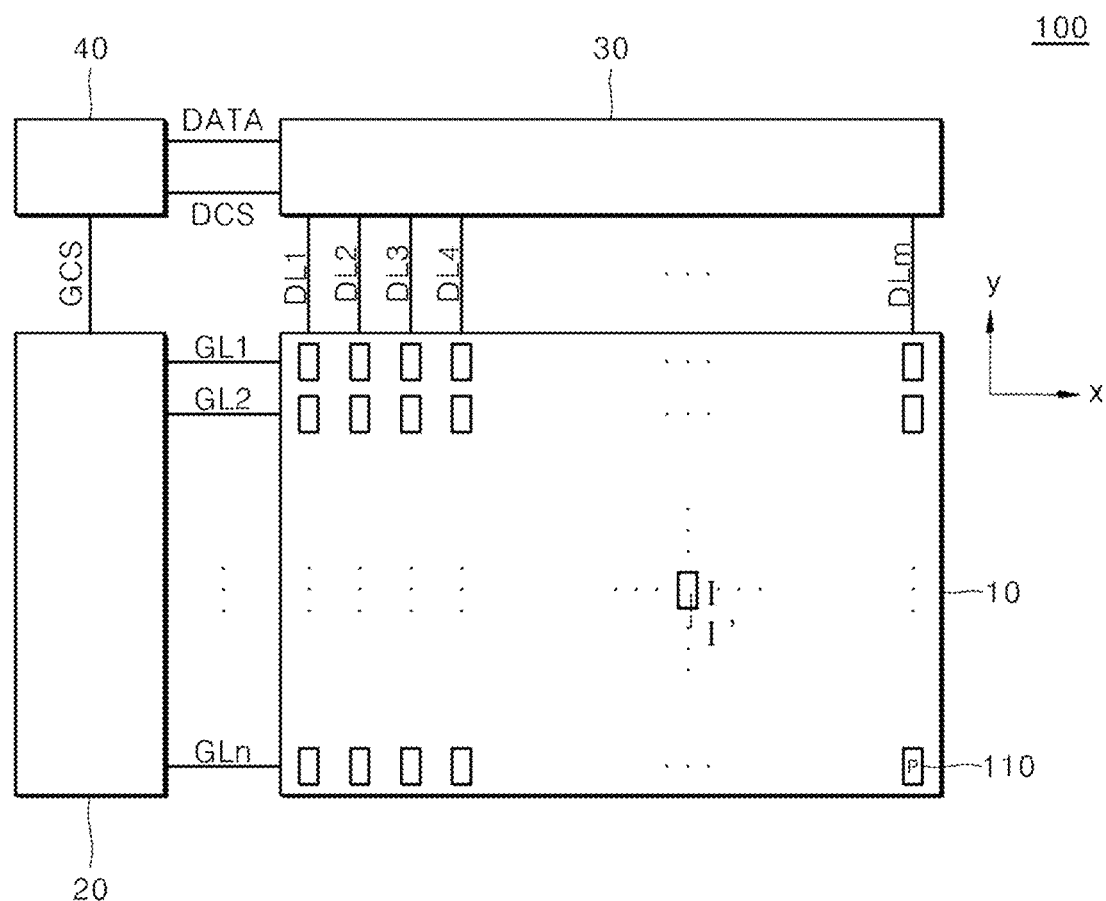
FIG. 1 is a configuration diagram schematically showing a configuration of a display device according to an embodiment of the present disclosure.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Hereinafter, an organic light-emitting display device and a manufacturing method thereof according to an embodiment of the present disclosure will be described.

FIG. 1 is a configuration diagram schematically showing a configuration of a display device according to an embodiment of the present disclosure.

Referring to FIG. 1, a display device 100 according to an embodiment of the present disclosure includes a display panel 10, a gate driver 20, a data driver 30 and a timing controller 40, and the like.

A plurality of data lines DL1 to DLm and a plurality of gate lines GL1 to GLn may be arranged in the display panel 10. A pixel may be disposed at an intersection area between one gate line and one data line. One pixel P may include at least one sub-pixel SP. Hereinafter, in an embodiment of the present disclosure, one pixel P may be referred to as a 'unit pixel'.

The display panel 10 may include a unit pixel 110 composed of at least one sub-pixel SP. Further, the unit pixel 110 may include one pixel P or at least one pixel P. In this connection, a structure of one unit pixel 110 will be described in more detail in FIGS. 2A and 2B.

The gate driver 20 may drive the plurality of gate lines GL1 to GLn.

The data driver 30 may drive the plurality of data lines DL1 to DLm.

The timing controller 40 may control the gate driver 20 and the data driver 30.

The gate driver 20 may sequentially supply a scan (gate) signal to the plurality of gate lines GL1 to GLn to sequentially drive the plurality of gate lines GL1 to GLn.

The data driver 30 may supply a data voltage to the plurality of data lines DL1 to DLm to drive the plurality of data lines DL1 to DLm.

The timing controller 140 may supply a control signal to the gate driver 20 and the data driver 30 to control the gate driver 20 and the data driver 30. The timing controller 40 may start a scan according to a timing implemented in each frame, may convert input image data input from an external component according to a data signal format to be used by the data driver 30, may output the converted image data, and may control data driving at an appropriate timing based on the scan.

The gate driver 20 sequentially supplies a scan signal of on-voltage or off-voltage to the plurality of gate lines GL1 to GLn under control of the timing controller 40 to sequentially drive the plurality of gate lines GL1 to GLn. Further, the gate driver 20 may be located only on one side of the display panel 10 as shown in FIG. 1, or may be located on both opposing sides thereof, according to a driving scheme or a display panel design scheme.

Further, the gate driver 20 may include at least one gate driver integrated circuit. Each gate driver integrated circuit may be connected to a bonding pad of the display panel 10 in a TAB (Tape Automated Bonding) scheme or in a COG (Chip-on-Glass) scheme. Alternatively, the gate driver integrated circuit may be directly disposed in the display panel 10 in a GIP (Gate in Panel) scheme. In some cases, the gate driver integrated circuit may be integrated into the display panel 10.

Further, each gate driver integrated circuit may be implemented in a COF (Chip On Film) scheme. In this case, a gate driver chip corresponding to each gate driver integrated circuit may be mounted on a flexible film. One end of the flexible film may be bonded to the display panel 10.

When a specific gate line is opened, the data driver 30 converts the image data received from the timing controller 40 into analog data voltage and supplies the analog data voltage to the plurality of data lines DL1 to DLm to drive the plurality of data lines DL1 to DLm. In addition, the data driver 30 may include at least one source driver integrated circuit to drive the plurality of data lines DL1 to DLm.

Each source driver integrated circuit may be connected to a bonding pad of the display panel 10 in a TAB (Tape Automated Bonding) scheme or in a COG (Chip-on-Glass) scheme. Alternatively, the source driver integrated circuit may be directly disposed in the display panel 10. In some cases, the source driver integrated circuit may be integrated into the display panel 10.

Further, each source driver integrated circuit may be implemented in a chip on film (COF) scheme. In this case, a source driver chip corresponding to each source driver integrated circuit may be mounted on the flexible film. One end of the flexible film may be bonded to at least one source printed circuit board. The other end thereof may be bonded to the display panel 10.

The source printed circuit board may be connected to a control printed circuit board through a connection medium such as a flexible flat cable (FFC) or a flexible printed circuit (FPC). The timing controller 40 is disposed on the control printed circuit board.

Further, a power controller (not shown) that supplies voltage or current to the display panel 10, the gate driver 20, and the data driver 30 or controls the voltage or the current to be supplied may be further disposed in the control printed circuit board. The source printed circuit board and the control printed circuit board as mentioned above may be integrated into a single printed circuit board.

In addition, although not shown in the drawing, a switching thin-film transistor T1, a driving thin-film transistor Tdr, a storage capacitor Cst, and a light-emitting diode OLED1 may be disposed in each pixel P.

Each of the switching thin-film transistor T1 and the driving thin-film transistor Tdr may include an active layer ACT, a gate electrode GE, a source electrode SE and a drain electrode DE. The light-emitting diode OLED1 may include an anode electrode AE, an organic light-emitting layer OLE, and a cathode electrode CE.

The gate electrode GE, the source electrode SE, and the drain electrode DE of the switching thin-film transistor T1 may be connected to the gate line GL, the data line DL and the gate electrode GE of the driving thin-film transistor Tdr, respectively. The gate electrode GE, the source electrode SE, and the drain electrode DE of the driving thin-film transistor Tdr may be connected to the drain electrode of the switching thin-film transistor T1, a positive electrode of the light-emitting diode OLED1, and a power line PL, respectively. The positive electrode and a negative electrode of the light-emitting diode OLED1 may be connected to the source electrode and a low-potential voltage Vss of the driving thin-film transistor Tdr, respectively.

In one example, the pixel P in accordance with the present disclosure includes at least one sub-pixel SP. The sub-pixel SP may mean a unit in which a color filter of a specific one type is formed or a color filter is not formed and an organic light-emitting element emits a special color. A color rendered in the sub-pixel may include red (R), green (G), blue (B) and optionally white (W), but may not be limited thereto.

Further, an electrode connected to a thin film transistor that controls light emission of each sub-pixel SP of the display panel 10 is referred to as the first electrode. An electrode disposed on a front face of the display panel 10 or disposed to include two or more pixels is referred to as a second electrode. When the first electrode is the anode electrode AE, the second electrode acts as the cathode electrode CE, or vice versa. Hereinafter, a case in which the anode electrode acts as one example of the first electrode and the cathode electrode acts as one example of the second electrode will be described. The present disclosure is not limited thereto.

The pixel P in accordance with the present disclosure includes at least one sub-pixel SP. For example, one pixel may include 2 to 4 sub-pixels. The sub-pixel SP may mean a unit in which a color filter of a specific one type is formed or a color filter is not formed and an organic light-emitting element emits a special color. A color rendered in the sub-pixel may include red (R), green (G), blue (B) and optionally white (W). The present disclosure is not limited thereto.

The present disclosure may be applied to an organic light-emitting display device having a bottom-emission scheme. The present disclosure is not limited thereto. In some cases, the present disclosure may also be applied to an organic light-emitting display device of a top-emission scheme or a dual-emission scheme.

Figure 2A:
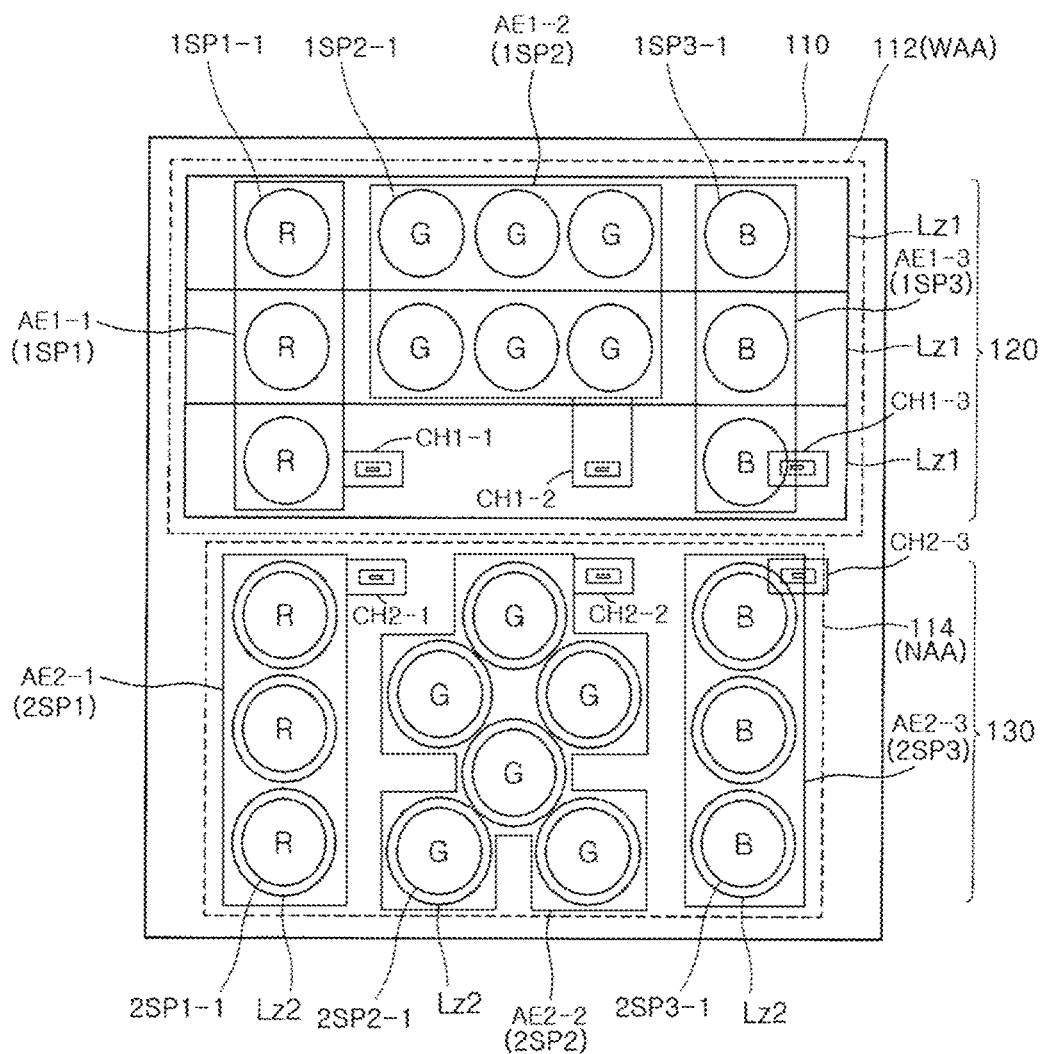
FIGS. 2A and 2B are a structural diagram schematically showing a unit pixel structure of a display panel according to an embodiment of the present disclosure.
Figure 2B:
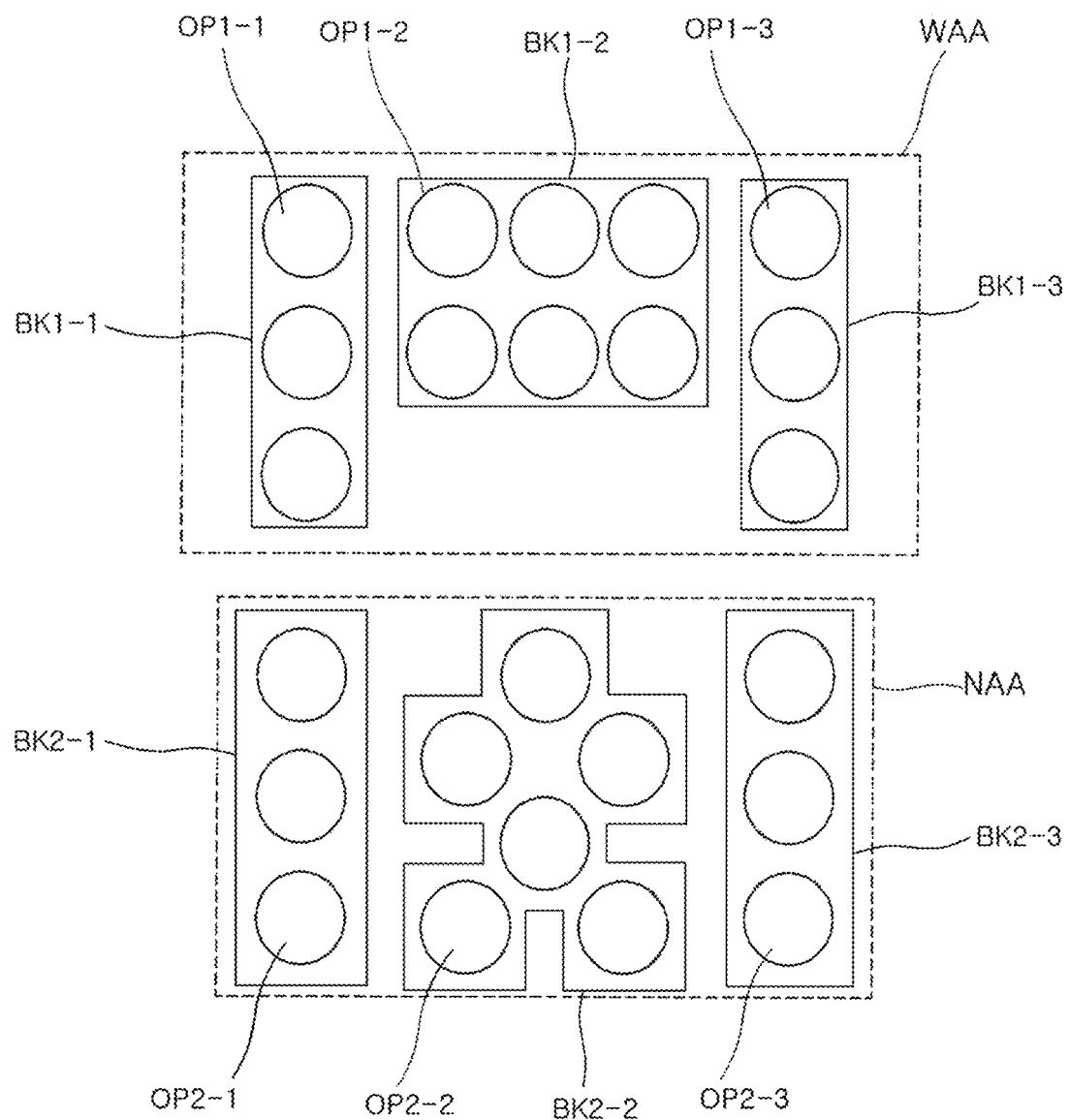

FIG. 2A and FIG. 2B are structural diagrams schematically showing a unit pixel structure of a display panel according to an embodiment of the present disclosure.

Referring to FIG. 2A and FIG. 2B, the display panel 10 according to an embodiment of the present disclosure may include a unit pixel 110, a first lens array 120, and a second lens array 130.

The unit pixel 110 may be divided into a wide-angle area WAA and a narrow-angle area NAA. At least one sub-pixel SP may be disposed in each of the wide-angle area WAA and the narrow-angle area NAA.

The first lens array 120 may include at least one first lens Lz1 disposed in the wide-angle area WAA.

The second lens array 130 may include at least one second lens Lz2 disposed in the narrow-angle area NAA.

The unit pixel 110 may include a first unit pixel 112 disposed in the wide-angle area WAA and a second unit pixel 114 disposed in the narrow-angle area NAA.

The first unit pixel 112 may be composed of at least one sub-pixel 1SP1, 1SP2, and 1SP3, and the second unit pixel 114 may be composed of at least one sub-pixel 2SP1, 2SP2, and 2SP3.

For example, the first unit pixel 112 may include a first sub-pixel 1SP1 of red (R), a second sub-pixel 1SP2 of green (G), and a third sub-pixel 1SP3 of blue (B), and may optionally include white (W). However, the disclosure is not limited thereto.

Further, the second unit pixel 114 may include a first sub-pixel 2SP1 of red (R), a second sub-pixel 2SP2 of green (G), and a third sub-pixel 2SP3 of blue (B), and may optionally include white (W). However, the disclosure is not limited thereto.

In this connection, the wide-angle area may be referred to as a 'wide viewing area' or a 'wide viewing angle area', while the narrow-angle area may be referred to as a 'narrow viewing area' or a 'narrow viewing angle area'. At least two sub-pixels SP may be continuously arranged in consideration of visibility and lens efficiency.

At least one sub-pixel may include a plurality of sub-sub-pixels.

The unit pixel 110 includes at least three sub-pixels SP. In the wide-angle area WAA, the first lens Lz1 may be formed to extend over at least two sub-pixels.

In the first unit pixel 112 as the wide-angle area WAA, the first sub-pixel 1SP1 may include at least one sub-sub-pixel 1SP1-1 of red (R). For example, the first sub-pixel 1SP1 may be composed of three sub-sub-pixels 1SP1-1 of red (R). The three sub-sub-pixels 1SP1-1 may be successively arranged in a vertical direction.

In this connection, the 3 sub-sub-pixels 1SP1-1 may receive data power from a first-first anode electrode AE1-1 via a first-first contact-hole CH1-1. The first-first anode electrode AE1-1 may be embodied as a metal film having a rectangular shape surrounding the three sub-sub-pixels 1SP1-1. The three sub-sub-pixel 1SP1-1 may be respectively exposed through three first-first openings OP1-1 of the same size and shape defined in a first-first bank BK1-1 as shown in FIG. 2B. The first-first bank BK1-1 may have the same shape and size as those of the first-first anode electrode AE1-1.

In the first unit pixel 112, the second sub-pixel 1SP2 may include at least one sub-sub-pixel 1SP2-1 of green (G). For example, the second sub-pixel 1SP2 may be composed of 6 sub-sub-pixels 1SP2-1 of green (G). The 6 sub-sub-pixels 1SP2-1 may be arranged in two rows extending horizontally and arranged vertically, wherein each row has 3 sub-sub-pixels.

In this connection, the 6 sub-sub-pixels 1SP2-1 may receive data power from a first-second anode electrode AE1-2 via a first-second contact-hole CH1-2. The first-second anode electrode AE1-2 may be embodied as a metal film with a rectangular shape surrounding the lower row of the 3 sub-sub-pixels 1SP2-1 and the upper row of the 3 sub-sub-pixels 1SP2-1. The 6 sub-sub-pixel 1SP2-1 may be respectively exposed through 6 first-second openings OP1-2 of the same size and shape defined in a first-second bank BK1-2 as shown in FIG. 2B. The first-second bank BK1-2 may have the same shape and size as those of the first-second anode electrode AE1-2.

In the first unit pixel 112, the third sub-pixel 1SP3 may include at least one blue (B) sub-sub-pixel 1SP3-1. For example, the third sub-pixel 1SP3 may be composed of 3 blue (B) sub-sub-pixels 1SP3-1. The three sub-sub-pixels 1SP3-1 may be sequentially arranged in a vertical direction.

In this connection, the 3 sub-sub-pixel 1SP3-1 may receive data power from a first-third anode electrode AE1-3 via a first-third contact-hole CH1-3. The first-third anode electrode AE1-3 may be embodied as a metal film of a rectangular shape surrounding the 3 sub-sub-pixels 1SP3-1. The 3 sub-sub-pixels 1SP3-1 may be respectively exposed through 3 first-third openings OP1-3 of the same size and shape defined in a first-third bank BK1-3 as shown in FIG. 2B. The first-third bank BK1-3 may have the same shape and size as those of the first-third anode electrode AE1-3.

In the second unit pixel 114 as the narrow-angle area NAA, the first sub-pixel 2SP1 may include at least one sub-sub-pixel 2SP1-1 of red (R). For example, the first sub-pixel 2SP1 may be composed of three red (R) sub-sub-pixels 2SP1-1. The three sub-sub-pixels 2SP1-1 may be sequentially arranged in a vertical direction.

In this connection, the 3 sub-sub-pixels 2SP1-1 may receive data power from a second-first anode electrode AE2-1 via a second-first contact-hole CH2-1. The second-first anode electrode AE2-1 may be embodied as a metal film having a rectangular shape surrounding the three sub-sub-pixels 2SP1-1. The three sub-sub-pixel 2SP1-1 may be respectively exposed through three second-first openings OP2-1 of the same size and shape defined in the second-first bank BK2-1 as shown in FIG. 2B. The second-first bank BK2-1 may have the same shape and size as those of the second-first anode electrode AE2-1.

In the second unit pixel 114 as the narrow-angle area NAA, the second sub-pixel 2SP2 may include at least one sub-sub-pixel 2SP2-1 of green (G). For example, the second sub-pixel 2SP2 may be composed of 6 sub-sub-pixels 2SP2-1 of green (G). The 6 sub-sub-pixels 2SP2-1 3 may be composed of 3 sub-sub-pixels 2SP2-1 arranged in an upper triangle shape and 3 sub-sub-pixels 2SP2-1 arranged in a lower triangle shape.

In this connection, the 6 sub-sub-pixel 2SP2-1 may receive data power from a second-second anode electrode AE2-2 via a second-second contact-hole CH2-2. The second-second anode electrode AE2-2 may be embodied as a metal film surrounding the 3 sub-sub-pixels 2SP2-1 arranged in the upper triangle shape and the 3 sub-sub-pixels 2SP2-1 arranged in a lower triangle shape. The 6 sub-sub-pixel 2SP2-1 may be respectively exposed through 6 second-second openings OP2-2 of the same size and shape defined in a second-second bank BK2-2 as shown in FIG. 2B. The second-second bank BK2-2 may have the same shape and size as those of the second-second anode electrode AE2-2.

In the second unit pixel 114 as the narrow-angle area NAA, the third sub-pixel 2SP3 may include at least one sub-sub-pixel 2SP3-1 of the blue (B) color. For example, the third sub-pixel 2SP3 may be composed of three blue (B) sub-sub-pixels 2SP3-1. The three sub-sub-pixels 2SP3-1 may be consecutively arranged in a vertical direction.

In this connection, the 3 sub-sub-pixels 2SP3-1 may receive data power from a second-third anode electrode AE2-3 via a second-third contact-hole CH2-3. The second-third anode electrode AE2-3 may be embodied as a metal film of a rectangular shape surrounding the 3 sub-sub-pixels 2SP3-1. The three sub-sub-pixels 2SP3-1 may be respectively exposed through 3 second-third openings OP2-3 of the same size and shape defined in a second-third bank BK2-3 as shown in FIG. 2B. The second-third bank BK2-3 may have the same shape and size as those of the second-third anode electrode AE2-3.

One first lens Lz1 of the first lens array 120 may be disposed in the wide-angle area WAA, or at least two first lenses Lz1 thereof may be disposed therein.

The first lens Lz1 may be a semi-cylindrical lens having a rectangular bottom.

When the first lens array 120 includes one first lens Lz1, one first lens Lz1 may be disposed to cover one unit pixel 112 or at least one sub-pixel SP. In this connection, one sub-pixel 1SP1 may include at least one sub-sub-pixel 1SP1-1.

When the first lens array 120 includes at least two first lenses Lz1, at least two first lenses Lz1 may have the same shape and the same size as each other and be disposed in the wide-angle area WAA.

The at least two first lenses Lz1 may have the same shape and different sizes and be disposed in the wide-angle area WAA.

One first lens Lz1 may be disposed on a top face of at least one sub-pixel SP to cover at least one sub-pixel SP in the wide-angle area WAA.

For example, in the first unit pixel 112 as the wide-angle area WAA, the first lens Lz1 may be disposed to cover the first sub-pixel 1SP1 of red (R), the second sub-pixel 1SP2 of green (G), and the third sub-pixel 1SP3 of blue (B), as shown in FIG. 2A.

Each of the at least three sub-pixels may include a plurality of sub-sub-pixels. The at least three sub-pixels may include the first sub-pixel 1SP1, the second sub-pixel 1SP2, and the third sub-pixel 1SP3 that emit different colors. The third sub-pixel may have the larger number of the plurality of sub-sub-pixels than each of the first sub-pixel and the second sub-pixel may have.

Further, in the first unit pixel 112, one first lens Lz1 may be disposed on top faces of and cover one sub-sub-pixel 1SP1-1 of the first sub-pixel 1SP1, three sub-sub-pixels 1SP2-1 of the second sub-pixel 1SP2, and one sub-sub-pixel 1SP3-1 of the third sub-pixel 1SP3, as shown in FIG. 2A.

Further, in the first unit pixel 112, one first lens Lz1 may be disposed on top faces of and cover one sub-sub-pixel 1SP1-1 of the first sub-pixel 1SP1 of red (R), and one sub-sub-pixel 1SP3-1 of the third sub-pixel 1SP3 of blue (B) as shown in FIG. 2A.

At least one second lens Lz2 of the second lens array 120 may be disposed in the narrow-angle area NAA.

The second lens Lz2 may be a semi-spherical lens having a circular bottom.

One second lens Lz2 of at least one second lens Lz2 may be disposed to cover one sub-pixel SP.

When one sub-pixel SP is composed of at least one sub-sub-pixel 2SP1-1, 2SP2-1, 2SP3-1, one second lens Lz2 may cover only one sub-sub-pixel 2SP1-1.

Accordingly, the three second lense Lz2 may cover three sub-sub-pixels 2SP1-1, 2SP2-1, and 2SP3-1, respectively. That is, each second lens Lz2 may cover each of the sub-sub-pixels 2SP1-1, 2SP2-1, and 2SP3-1 constituting one sub-pixel 2SP1.

At least one second lens Lz2 in the narrow-angle area NAA may have the same shape, the same size, and the same thickness (vertical dimension).

Each second lens Lz2 may be individually formed on each of a plurality of sub-sub-pixels in the narrow-angle area NAA.

Each second lens Lz2 may be individually disposed on a top face of each sub-pixel SP to cover only each sub-pixel SP in the narrow-angle area NAA.

The second lens Lz2 may have a bottom face having an area larger than a light-emitting area of each sub-sub-pixel.

At least one of the first sub-pixel 2SP1 of a first color (R), the second sub-pixel 2SP2 of a second color (G), the third sub-pixel 2SP3 of a third color (B), and the fourth sub-pixel 2SP4 of a fourth color (W) may be disposed in the narrow-angle area NAA. Alternatively, at least one sub-pixel SP of the first sub-pixel 2SP1 of a first color (R), the second sub-pixel 2SP2 of a second color (G), the third sub-pixel 2SP3 of a third color (B), and the fourth sub-pixel 2SP4 of a fourth color (W) may be arranged according to a combination thereof.

Each of at least one second lens Lz2 may individually cover each of the sub-pixel SP of the first color (R), the sub-pixel SP of the second color (G), the sub-pixel SP of the third color (B), and the sub-pixel SP of the fourth color (W). Alternatively, each of at least one second lens Lz2 may individually cover each sub-sub-pixel.

The first lens Lz1 and the second lens Lz2 may have different shapes and different sizes.

Each of the first lens Lz1 and the second lens Lz2 may be implemented as a concave or convex lens according to a refractive index.

The refractive index of each of the first lens Lz1 and the second lens Lz2 may be determined according to a shape and a thickness (vertical dimension) thereof.

Figure 3:
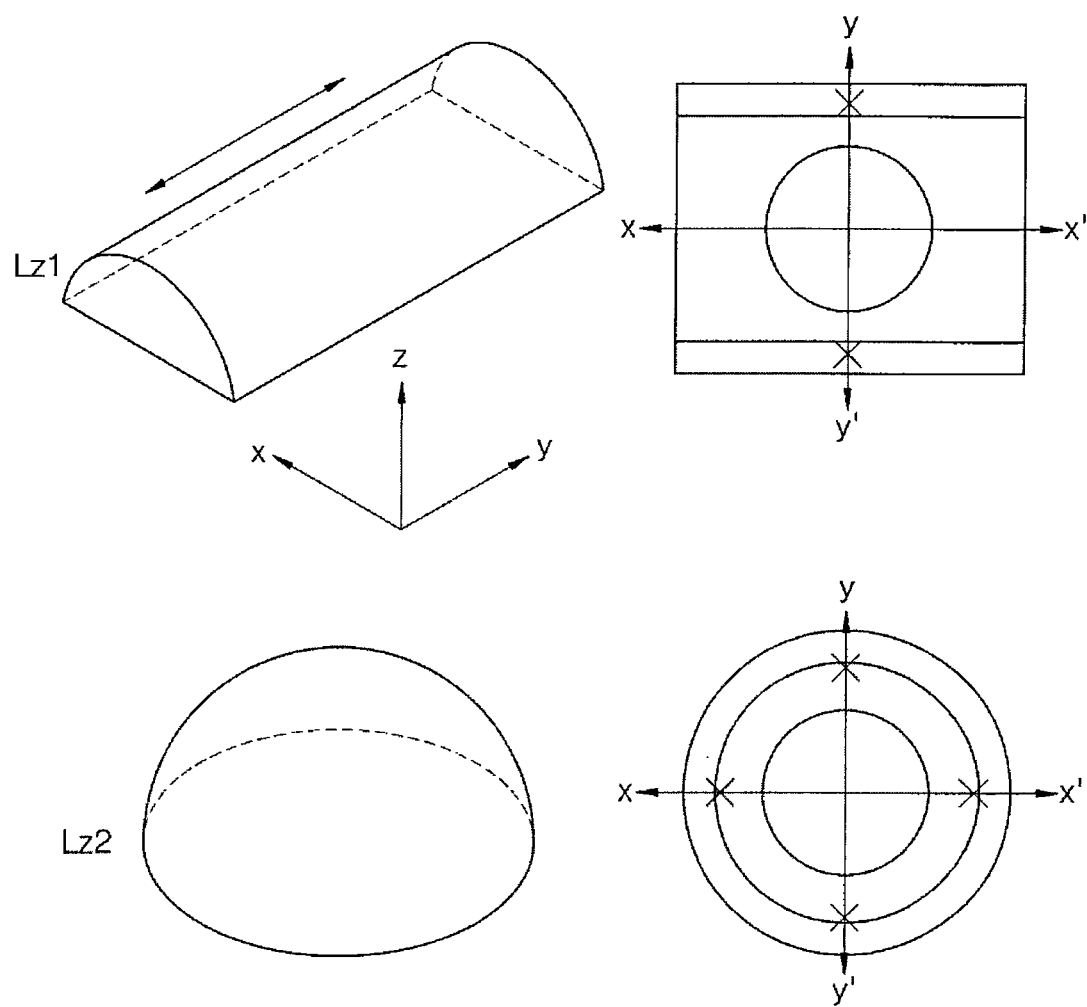
FIG. 3 is a view showing a shape and a cutoff direction of each of a first lens and a second lens disposed in a unit pixel of a display panel according to an embodiment of the present disclosure.

FIG. 3 is a view showing a shape and a cutoff direction of each of the first lens and the second lens disposed on the unit pixel of the display panel according to an embodiment of the present disclosure.

Referring to FIG. 3, in the unit pixel 110 according to an embodiment of the present disclosure, the first lens Lz1 may be a semi-cylindrical lens, and the second lens Lz2 may be a semi-spherical lens.

The first lens Lz1 and the second lens Lz2 may have different shapes and different sizes.

The first lens Lz1 and the second lens Lz2 may have different shapes and different sizes, but may have the same thickness (vertical dimension).

The first lens Lz1 and the second lens Lz2 may have different shapes, different sizes, and different thicknesses or vertical dimensions.

The first lens Lz1 may have a semi-cylindrical shape having a rectangular bottom face. Thus, a light-emitting direction thereof may be cut off in a y-y' direction (vertical direction) and may not be cut off in a x-x' direction (horizontal direction).

That is, because the first lens Lz1 has a length that exceeds a width of one sub-pixel SP in an x-axis direction, the first lens is not cut off in the x-x' direction (horizontal direction). The first lens has a curvature and a width thereof in the x-x' direction is smaller as it extends upward along the z-axis. Thus, the first lens is cut off in the y-y' direction (vertical direction).

The second lens Lz2 is a semi-spherical type with a circular bottom face. The second lens has a curvature, and a width thereof in each of the x-x' direction (horizontal direction) and the y-y' direction (vertical direction) is smaller as it extends upward along the z-axis.

Therefore, the light-emitting direction may be cut off from the circular bottom face and by a width of one sub-pixel SP and in all of the x-x' direction (horizontal direction) and in the y-y' direction (vertical direction). In this connection, one sub-pixel SP covered with one second lens Lz2 may mean one sub-sub-pixel 2SP1-1 covered with one second lens Lz2 of the semi-spherical shape or may mean one sub-pixel 2SP1 composed of only one sub-sub-pixel 2SP1-1. This may be equally applied to following descriptions.

As described above, a size of each of one sub-pixel SP, the first lens Lz1, and the second lens Lz2 may vary according to an optical output cut-off angle.

Further, the size of each of one sub-pixel SP, the first lens Lz1, and the second lens Lz2 may vary according to light efficiency and light concentration of one sub-pixel SP.

FIGS. 4 to 8 are views showing examples in which a first lens array is composed of at least two first lenses in a wide-angle area of a display panel according to an embodiment of the present disclosure.

Figure 4:
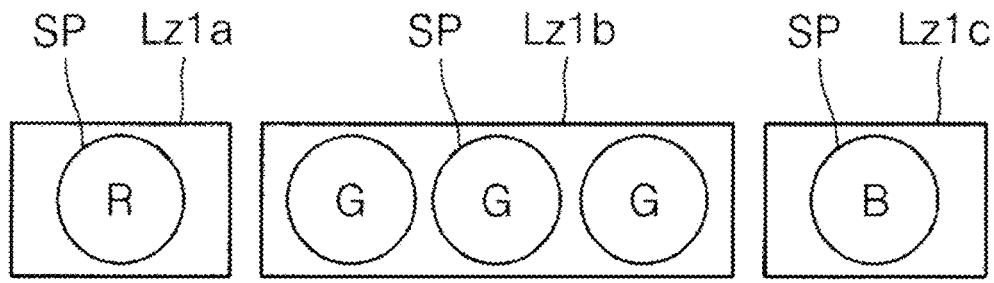
FIGS. 4 to 8 are views showing examples in which at least two or more first lenses are arranged in a first lens array in a wide-angle area of a display panel according to an embodiment of the present disclosure.

Referring to FIG. 4, the first lens array 120 according to an embodiment of the present disclosure may be disposed in the wide-angle area WAA in the unit pixel 110 of the display panel 10 and may include a first lens Lz1a covering a sub-pixel SP of the first color (R), a first lens Lz1b covering at least one sub-pixel SP of the second color (G), and a first lens Lz1c covering a sub-pixel SP of the third color (B).

That is, the first lens array 120 according to an embodiment of the present disclosure may include a plurality of the first lenses Lz1, wherein one first lens Lz1 may cover one sub-pixel SP or cover at least one sub-pixel SP.

In this connection, at least one of the sub-pixel SP of the first color (R), the sub-pixel SP of the second color (G), the sub-pixel SP of the third color (B), and the sub-pixel SP of the fourth color (W) may be disposed in the wide-angle area WAA. Alternatively, at least one sub-pixel SP of the sub-pixel SP of the first color (R), the sub-pixel SP of the second color (G), the sub-pixel SP of the third color (B), and the sub-pixel SP of the fourth color (W) may be arranged in the wide-angle area WAA according to a combination thereof.

One first lens Lz1 or two or more first lenses Lz1 may cover at least one of the sub-pixel SP of the first color (R), the sub-pixel SP of the second color (G), the sub-pixel SP of the third color (B), and the sub-pixel SP of the fourth color (W), which may be disposed in the wide-angle area WAA. Alternatively, one first lens Lz1 or two or more first lenses Lz1 may cover at least one sub-pixel SP of the sub-pixel SP of the first color (R), the sub-pixel SP of the second color (G), the sub-pixel SP of the third color (B), and the sub-pixel SP of the fourth color (W) which is arranged in the wide-angle area WAA according to a combination thereof.

Figure 5:
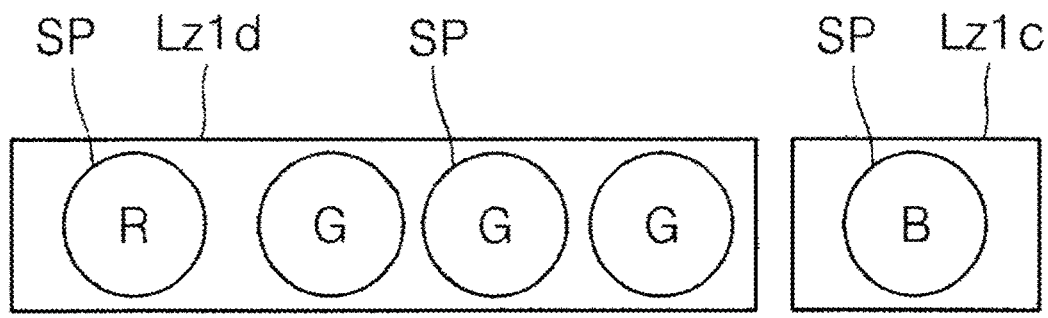

Referring to FIG. 5, a first lens array 120 according to an embodiment of the present disclosure may include a first lens Lz1d covering one sub-pixel SP of the first color (R) and at least one (for example, three) sub-pixel SP of the second color (G), and a first lens Lz1c covering the sub-pixel SP of the third color (B).

That is, the first lens Lz1 may be disposed to cover sub-pixels SP of different colors (R and G) among the sub-pixel SP of the first color (R), the sub-pixel SP of the second color (G), and the sub-pixel SP of the third color (B), or may be disposed to cover only one sub-pixel SP of the third color (B).

Figure 6:
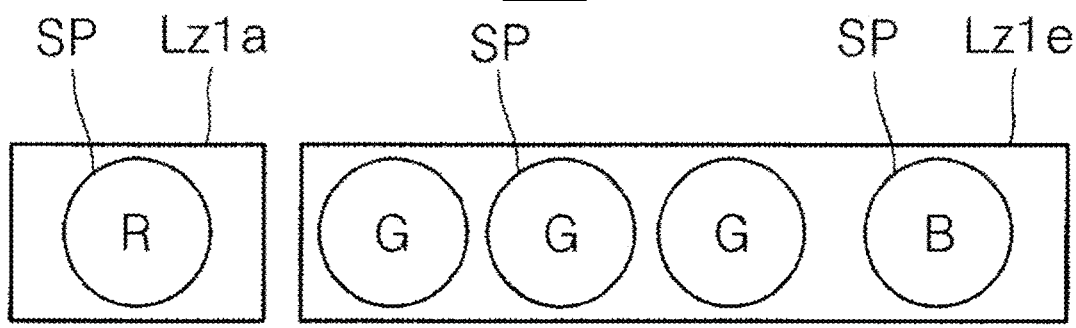

Referring to FIG. 6, a first lens array 120 according to an embodiment of the present disclosure may include a first lens Lz1a covering one sub-pixel SP of the first color (R), and a first lens Lz1e covering at least one (for example, three) sub-pixel SP of the second color (G) and one sub-pixel SP of the third color (B).

That is, the first lens Lz1 may be disposed to cover only the sub-pixel SP of one color (R) or cover the sub-pixels SP of different colors (G and B). In this connection, a plurality of sub-pixels SP of one color (G) may be present in the sub-pixels SP of the different colors (G and B).

Figure 7:
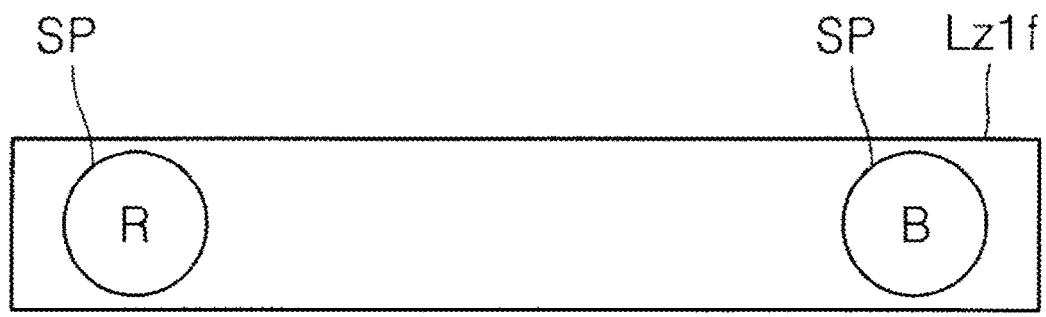

Referring to FIG. 7, a first lens array 120 according to an embodiment of the present disclosure may include a first lens Lz1f covering one sub-pixel SP of the first color (R) and one sub-pixel SP of the third color (B).

That is, the first lens Lz1 may be disposed to cover sub-pixels SP of different colors (G and B) that are spaced apart from each other.

Figure 8:
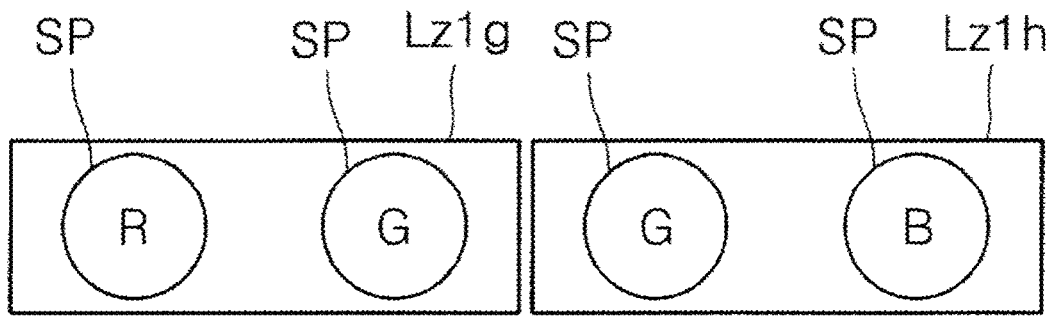

Referring to FIG. 8, a first lens array 120 according to an embodiment of the present disclosure may include a first lens Lz1g covering one sub-pixel SP of the first color (R) and one sub-pixel SP of the second color G, and a first lens Lz1h covering one sub-pixel SP of the second color (G) and one sub-pixel SP of the third color (B).

That is, the first lens Lz1 may include two lens which may cover two combinations of two sub-pixels SP of different colors, respectively. In this connection, the two combinations of the two different colors may be different from each other.

Figure 9:
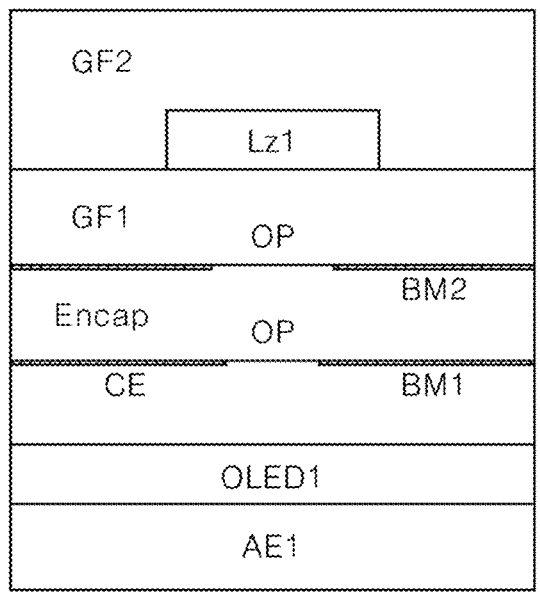
FIG. 9 is a cross-sectional view taken along a I-I' line of FIG. 1 in a display device according to an embodiment of the present disclosure.
Figure 9:
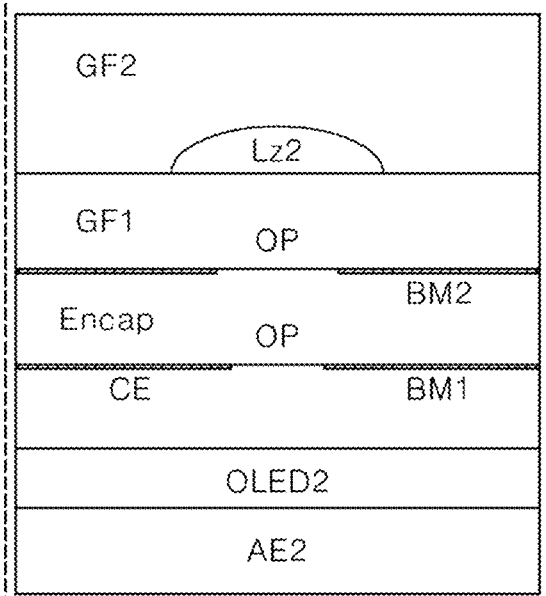

FIG. 9 is a cross-sectional view of a unit pixel in a display device according to an embodiment of the present disclosure as cut along a I-I' line in FIG. 1.

Referring to FIG. 9, the unit pixel 110 of the display panel 10 according to an embodiment of the present disclosure may include the wide-angle area WAA and the narrow-angle area NAA.

The unit pixel 110 may include at least one sub-pixel SP.

The at least one sub-pixel SP may include a first anode electrode layer AE1 in the wide-angle area WAA, a second anode electrode layer AE2 in the narrow-angle area NAA, a first light-emitting layer OLED1 and a second light-emitting layer OLED2 respectively on the first anode electrode layer AE1 and the second anode electrode layer AE2, and a cathode electrode layer CE on both the first light-emitting layer OLED1 and the second light-emitting layer OLED2. Further, the at least one sub-pixel SP may include a first barrier layer BM1 on the cathode electrode layer CE, a first insulating layer Encap on the first barrier layer, a second barrier layer BM2 on the first insulating layer, a first gap-fill layer GF1 on the second barrier layer, a first lens Lz1 on the first gap-fill layer and in the wide-angle areas, a second lens Lz2 on the first gap-fill layer and in the narrow-angle areas, and a second gap-fill layer GF2 on both the first lens and second lens. In this connection, each of the first barrier layer and the second barrier layer may be opened in each of an area overlapping the first anode electrode layer and an area overlapping the second anode electrode layer.

The wide-angle area WAA may include the first anode electrode layer AE1; the first light-emitting layer OLED1 on the first anode electrode layer; the cathode electrode layer CE on the first light-emitting layer; the first barrier layer BM1 having an opening defined therein and disposed on the cathode electrode layer; the first insulating layer Encap on the first barrier layer; the second barrier layer BM2 having an opening defined therein and disposed on the first insulating layer; the first gap-fill layer GF1 on the second barrier layer; the first lens Lz1 on the first gap-fill layer; and the second gap-fill layer GF2 on the first lens.

In this connection, the openings OP of the first barrier layer BM1 and the second barrier layer BM2 may have the same size and the same thickness.

The first barrier layer BM1 and the second barrier layer BM2 may, for example, prevent light from being incident to the active layer ACT of the driving thin-film transistor Tdr to prevent leakage current from being generated.

The narrow-angle area NAA may include the second anode electrode layer AE2; the second light-emitting layer OLED2 on the second anode electrode layer; the cathode electrode layer CE on the second light-emitting layer; the first barrier layer BM1 having a opening defined therein and disposed on the cathode electrode layer; the first insulating layer Encap on the first barrier layer; the second barrier layer BM2 having an opening defined therein and disposed on the first insulating layer; the first gap-fill layer GF1 on the second barrier layer; the second lens Lz2 on the first gap-fill layer; and the second gap-fill layer GF2 on the second lens.

In this connection, the openings OP of the first barrier layer BM1 and the second barrier layer BM2 may have the same size and the same thickness.

The first anode electrode layer AE1 of the wide-angle area WAA and the second anode electrode layer AE2 of the narrow-angle area NAA may constitute the same layer and may be made of the same material and may have the same thickness and may be formed using the same process. The first and second anode electrode layers AE1 and AE2 may be formed by a mask process using photoresist (PR).

The first light-emitting layer OLED1 of the wide-angle area WAA and the second light-emitting layer OLED2 of the narrow-angle area NAA may constitute the same layer and may be made of the same material and may have the same thickness and may be formed using the same process and may render the same color.

Each of the first light-emitting layer OLED1 and the second light-emitting layer OLED2 may include a hole injecting layer HIL, a hole transporting layer HTL, a light emitting material layer EML, an electron transporting layer ETL, and an electron injecting layer EIL.

The first gap-fill layer GF1 of the wide-angle area WAA and the first gap-fill layer GF1 of the narrow-angle area NAA may constitute the same layer and may be made of the same material and may have the same thickness and may be formed using the same process.

A spacing between the first light-emitting layer OLED1 and the first lens Lz1 may be adjusted based on the thickness (vertical dimension) of the first gap-fill layer GF1. Further, a spacing between the second light-emitting layer OLED2 and the second lens Lz2 may be adjusted based on the thickness (vertical dimension) of the first gap-fill layer GF1.

The first gap-fill layer GF1 may be made of one of acrylic, epoxy, and silicon or combinations thereof. Further, the first gap-fill layer GF1 may be made of an organic material.

A particle size in the first gap-fill layer GF1 may be equal to a wavelength of light, or may be larger or smaller than the wavelength of light by a certain range. The first gap-fill layer GF1 may have forward diffusion property based on one of a particle density, a particle size, and a particle shape.

In this connection, the first gap-fill layer GF1 may have a smaller refractive index than that of the first insulating layer Encap. That is, the first gap-fill layer GF1 may have a smaller refractive index than that of the first insulating layer Encap due to one of the particle density, size, and shape.

A material of the first insulating layer Encap may be one of $TiO_2$, $Al_2O_3$, and $SiO_2$.

In this connection, when the material of the first insulating layer Encap is $TiO_2$, the first insulating layer Encap may have a refractive index in a range of 2.6 to 2.9. When the material of the first insulating layer Encap is $Al_2O_3$, the first insulating layer Encap may have a refractive index in a range of 1.75 to 1.76. When the material of the first insulating layer Encap is $SiO_2$, the first insulating layer Encap may have a refractive index in a range of 1.40 to 1.55.

The first lens Lz1 of the wide-angle area WAA and the second lens Lz2 of the narrow-angle area NAA may constitute the same layer and may be made of the same material and may have the same thickness and may be formed using the same process. However, the first lens Lz1 of the wide-angle area WAA and the second lens Lz2 of the narrow-angle area NAA may be formed to have different shapes and different sizes.

The refractive indices of the layers of the wide-angle area WAA and the narrow-angle area NAA may be similar to each other.

In the wide-angle area WAA and the narrow-angle area NAA, the cathode electrode CE may be disposed on the second gap-fill layer GF2. The cathode electrode CE may be made of at least one selected from a group of conductive metals including opaque metal materials, for example, aluminum (Al), tungsten (W), copper (Cu), molybdenum (Mo), chromium (Cr), tantalum (Ta), titanium (Ti), and alloys thereof combinations thereof. However, the disclosure is not limited thereto.

Each of refractive indices of the first lens Lz1 and the second lens Lz2 may be determined according to a shape of each of the first and second lenses and a thickness (vertical dimension) of the first gap-fill layer GF1.

Figure 10:
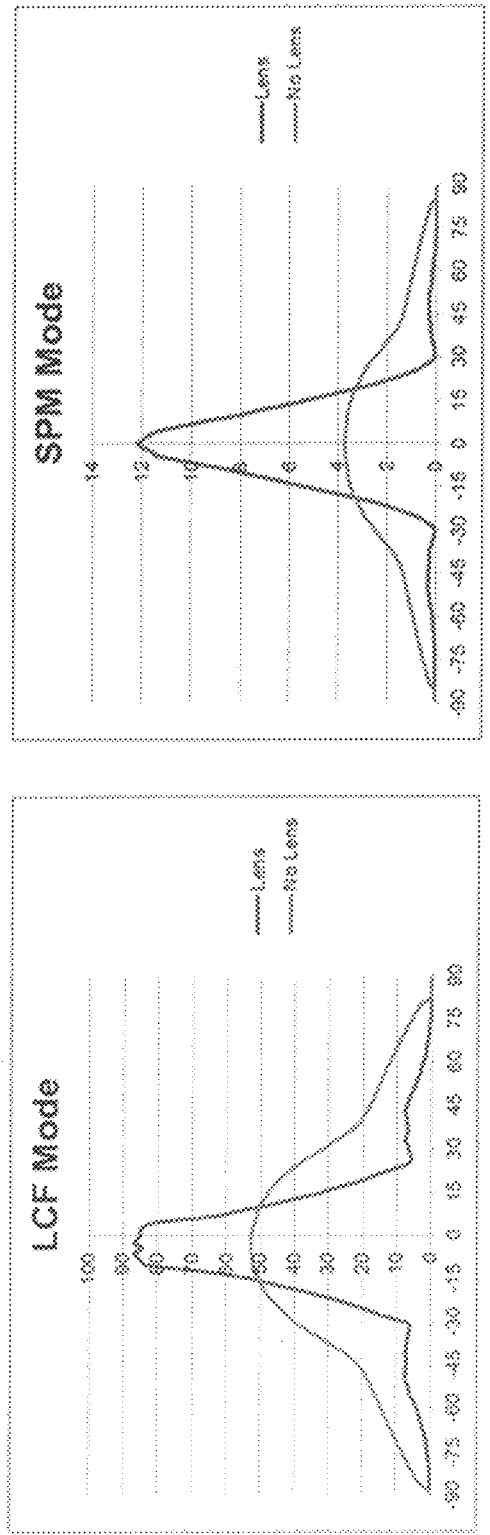
FIG. 10 is a diagram showing a size and luminance efficiency of each of a first lens in a wide-angle area and a second lens in a narrow-angle area in a display panel according to an embodiment of the present disclosure.
Figure 10:
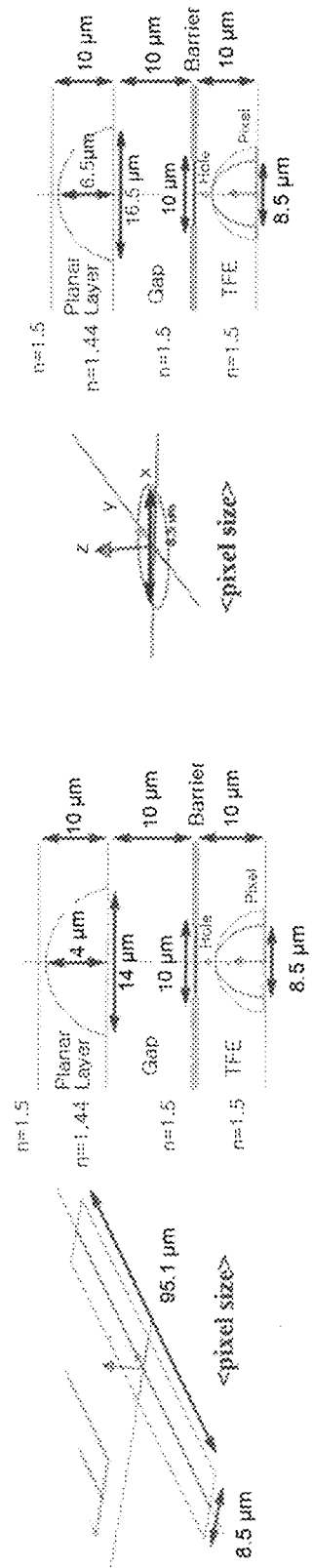

FIG. 10 is a diagram showing a size and luminance efficiency of each of the first lens in the wide-angle area and the second lens in the narrow-angle area in the display panel according to an embodiment of the present disclosure.

Referring to FIG. 10, the first lens Lz1 disposed in the wide-angle area WAA in the unit pixel 110 according to an embodiment of the present disclosure may be a semi-cylindrical lens whose a width of a bottom may be 14 µm, and a thickness (vertical dimension) may be 4 µm. A curvature of the lens may be optimized by adjusting a shape thereof according to a shape of the pixel.

In this connection, a pixel size may be 8.5 µm in the x-axis direction and 95.1 µm in the y-axis direction along a rectangular bottom shape of the first lens Lz1.

In the wide-angle area WAA of the unit pixel 110, for example, a thickness (vertical dimension) of each of the layers may be 10 µm, and a refractive index n thereof may be 1.5.

The first light-emitting layer OLED1 may have a width of a bottom face of 8.5 µm, a vertical dimension of 10 µm or smaller, and a refractive index n of 1.5.

The first barrier layer BM1 disposed on the first light-emitting layer OLED1 may have the opening OP defined therein. A size of the opening OP may be 10 µm, which is larger than 8.5 µm which is a minimum bottom width of the first light-emitting layer OLED1.

The first gap-fill layer GF1 disposed on the first barrier layer BM1 may have a thickness (vertical dimension) of 10 µm and a refractive index n of 1.5.

The first lens Lz1 disposed on the first gap-fill layer GF1 may have a vertical dimension of 4 µm. A layer in which the first lens Lz1 is disposed may have a refractive index n of 1.44 to 1.64.

The first lens Lz1 disposed in the wide-angle area WAA in the unit pixel 110 may operate in a LCF (Light Control Film) mode.

Therefore, it may be identified that the luminance efficiency under the presence of the first lens Lz1 may be 165% of that when there is no lens in the wide-angle area WAA of the unit pixel 110.

In this connection, a cut-off angle of the first lens Lz1 may be set to ±30° when an amount of light L of a pixel disposed below the first lens Lz1 it is 10%.

In one example, a size of the pixel disposed in the narrow-angle area NAA in the unit pixel 110 according to an embodiment of the present disclosure may be 8.5 μm in diameter, and a thickness (vertical dimension) of the second light-emitting layer OLED2 may be 10 μm. A refractive index n of the second light-emitting layer OLED2 may be set to 1.5.

The second barrier layer BM2 located on the second light-emitting layer OLED2 may have the opening OP defined therein. A size of the opening OP may be 10 μm, which is larger than 8.5 μm which is a minimum bottom width of the second light-emitting layer OLED2.

The first gap-fill layer GF1 disposed on the second barrier layer BM2 may have a thickness (vertical dimension) of 10 μm and a refractive index n of 1.5.

The second lens Lz2 disposed on the first gap-fill layer GF1 may be a semi-spherical lens whose a diameter of a circular bottom may be 16.5 μm, which is larger than a pixel diameter of 8.5 μm, and whose a vertical dimension may be 6.5 μm.

The layer in which the second lens Lz2 is disposed may have 10 μm of a thickness (vertical dimension) larger than a thickness (vertical dimension) of the second lens Lz2 of 6.5 μm.

In the narrow-angle area NAA of the unit pixel 110, for example, a thickness (vertical dimension) of each of the layers may be 10 μm, and the refractive index n thereof may be 1.5.

The second lens Lz2 disposed in the narrow-angle area NAA of the unit pixel 110 may operate in the SPM mode.

Therefore, it may be identified that luminance efficiency under the presence of the second lens Lz2 may be 327% of that when there is no lens in the wide-angle area WAA of the unit pixel 110.

In this connection, the cut-off angle of the second lens Lz2 may be set to ±30° when the amount of light L of the pixel disposed below the second lens is 10%.

Figure 11:
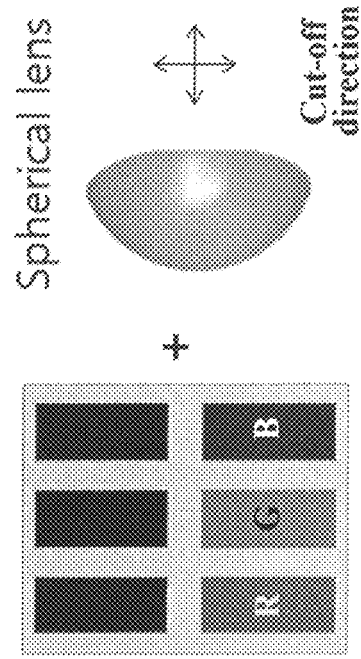
FIG. 11 is a view showing examples in which each of a first lens and a second lens according to an embodiment of the present disclosure outputs an image while cutting off light in each of a wide-angle area and a narrow-angle area in a display panel.
Figure 11:
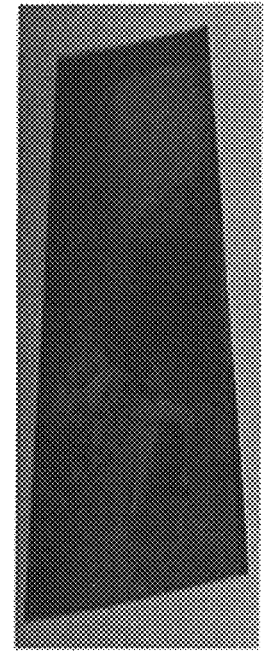
Figure 11:
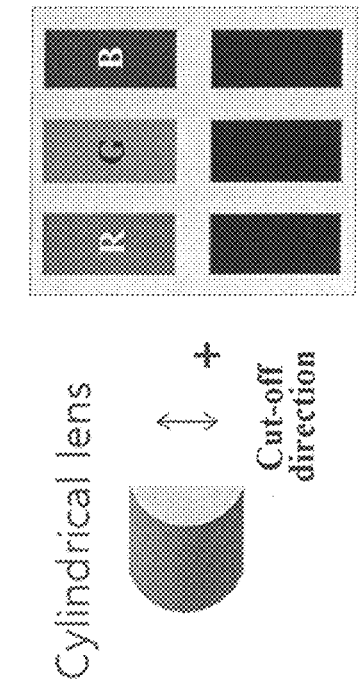
Figure 11:
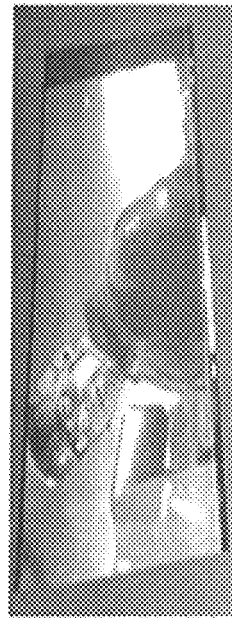

FIG. 11 is a view showing examples in which each of a first lens and a second lens according to an embodiment of the present disclosure outputs an image while cutting off light in each of a wide-angle area and a narrow-angle area in a display panel.

Referring to FIG. 11, the first lens Lz1 disposed in the wide-angle area WAA in the unit pixel 110 according to an embodiment of the present disclosure may be a semi-cylindrical lens and thus may cut off the light emitting from the sub-pixel SP in the y-y' direction.

Accordingly, the first lens Lz1 may cut off light output from the sub-pixel SP of the first color (R), the sub-pixel SP of the second color (G), the sub-pixel SP of the third color (B), and the sub-pixel SP of the fourth color (W) arranged in the wide-angle area WAA, and thus may act as a light control film (LCF) in a normal mode.

Further, because the second lens Lz2 disposed in the narrow-angle area NAA in the unit pixel 110 according to an embodiment of the present disclosure is a semi-spherical lens, the second lens may cut off the light emitting from the sub-pixel SP in the x-x' and y-y' directions.

Accordingly, the second lens Lz2 may cut off light output from the sub-pixel SP of the first color (R), the sub-pixel SP of the second color (G), the sub-pixel SP of the third color (B), and the sub-pixel SP of the fourth color (W) arranged in the narrow-angle area NAA and thus may operate in a SPM mode.

Figure 12:
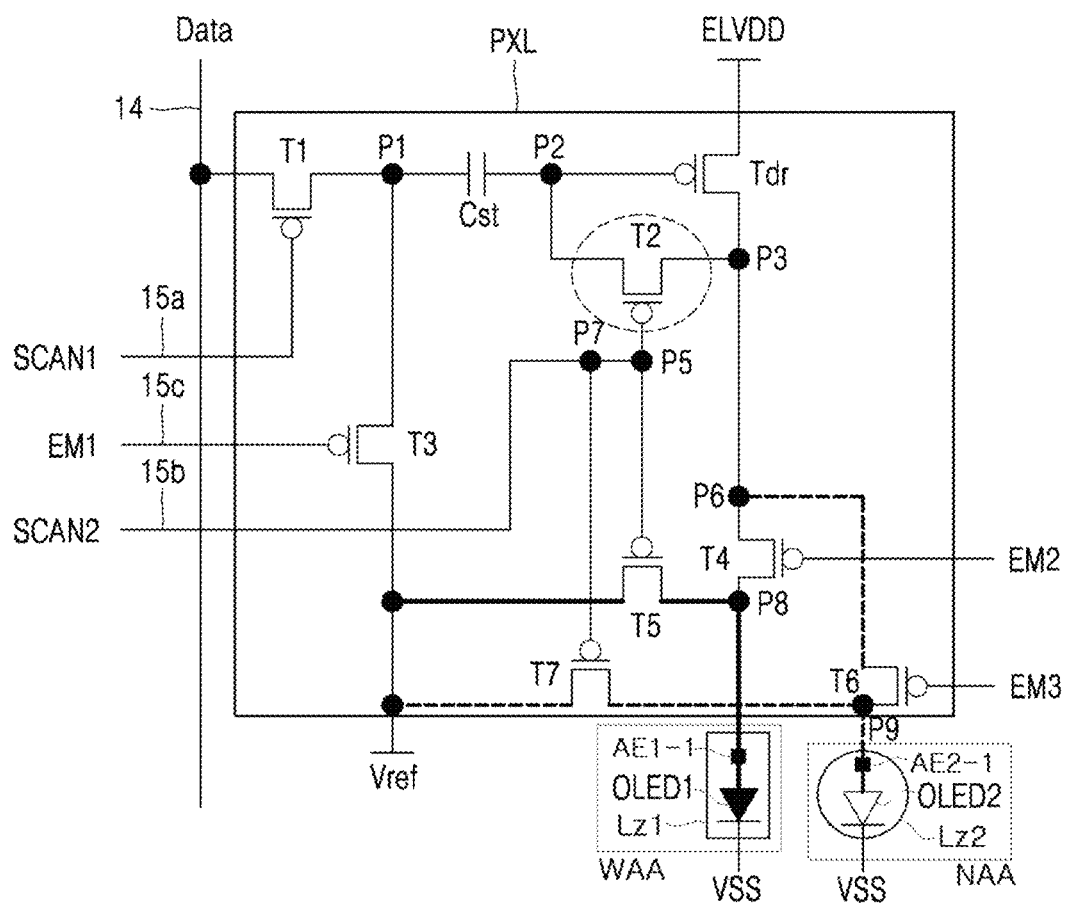
FIG. 12 is a diagram showing an example of a pixel circuit configuration of a unit pixel of a display panel according to an embodiment of the present disclosure.
Figure 13:
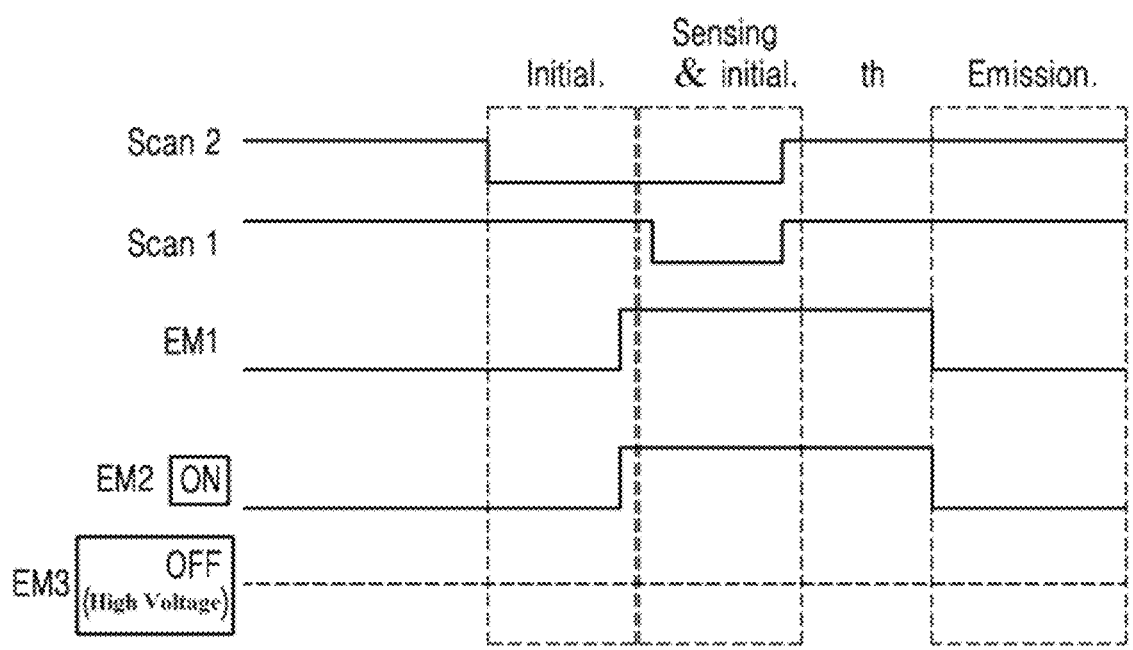
FIG. 13 is a diagram showing timing of a control signal for driving the pixel circuit of FIG. 12.

FIG. 12 shows an example of a pixel circuit configuration of the unit pixel of the display panel according to an embodiment of the present disclosure. FIG. 13 shows timing of a control signal for driving the pixel circuit of FIG. 12.

Referring to FIG. 12 and FIG. 13, a pixel PXL in the unit pixel 110 according to an embodiment of the present disclosure may include a first light-emitting diode OLED1, a second light-emitting diode OLED2, a driving transistor Tdr, and an internal compensation circuit CC.

In this connection, the first light-emitting diode OLED1 may be disposed in the wide-angle area WAA. The second light-emitting diode OLED2 may be disposed in the narrow-angle area NAA. The first lens Lz1 may be disposed on the first light-emitting diode OLED1. The second lens Lz2 may be disposed on the second light-emitting diode OLED2.

Each of transistors T1 to T7, and Tdr included in the pixel PXL may be implemented as a PMOS-type LTPS (Low Temperature Poly Silicon) TFT, and thus may secure desired response properties. For example, at least one transistor among switch transistors T1 to T7 may be implemented as an NMOS type or PMOS type oxide TFT having good leakage current properties when being turned off, while each of remaining transistors may be implemented as a PMOS-type LTPS TFT with good response properties.

The unit pixel 110 may include at least one sub-pixel SP. The at least one sub-pixel SP may further include a first transistor T1 connected to a data line Data, a driving transistor Tdr connected to driving power ELVDD, a fourth transistor T4 disposed between and connected to the driving transistor and the first anode electrode layer AE1-1 and switchable based on a first light-emitting control signal EM2, and a sixth transistor T6 disposed between and connected to the driving transistor and the second anode electrode layer AE2-1 and switchable based on a second light-emitting control signal EM3. The at least one sub-pixel SP may share the same data line data and the same driving transistor Tdr.

In this connection, the first transistor T1 is referred to as a 'first switch transistor T1', the fourth transistor T4 is referred to as a 'first light-emission control thin-film transistor T4', and the sixth transistor T6 is referred to as a 'second light-emission control thin-film transistor T6'.

Further, the first to seventh transistors T1 to T7 may be referred to as a first switch transistor T1 to a seventh switch transistor T7, respectively.

Each of the first light-emitting diode OLED1 and the second light-emitting diode OLED2 may emit light based on a current amount adjusted according to voltage Vgs between a gate and a source of the driving transistor Tdr.

The first light-emitting diode OLED1 may be connected to the driving transistor Tdr through first light-emission control thin-film transistor T4, while the second light-emitting diode OLED2 may be connected to the driving transistor Tdr through the second light-emission control thin-film transistor T6.

A gate electrode of the first light-emission control thin-film transistor T4 may be connected to a first light-emission control signal application line EM2. One of first and second electrodes thereof may be connected to the driving transistor Tdr, and the other thereof may be connected to the first light-emitting diode OLED1.

A gate electrode of the second light-emission control thin-film transistor T6 may be connected to a second light-emission control signal application line EM3. One of a first electrode and a second electrode thereof may be connected to the driving transistor Tdr, and the other thereof may be connected to the second light-emitting diode OLED2.

The first anode electrode AE1-1 of the first light-emitting diode OLED1 may be connected to the first electrode or the second electrode of the first light-emission control thin-film transistor T4. The cathode electrode of the first light-emitting diode OLED1 may be connected to a low-potential power voltage VSS. For example, the first light-emitting diode OLED1 may receive power through the first anode electrode AE1-1. An organic compound layer as the first light-emitting layer OLED1 may be disposed between the anode electrode and the cathode electrode.

The second anode electrode AE2-1 of the second light-emitting diode OLED2 may be connected to the first electrode or the second electrode of the second light-emission control thin-film transistor T6. The cathode electrode of the second light-emitting diode OLED2 may be connected to a low-potential power voltage VSS. For example, the second light-emitting diode OLED2 may receive power through the second anode electrode AE2-1. An organic compound layer as the second light-emitting layer OLED2 may be disposed between the anode electrode and the cathode electrode.

The organic compound layer may include a hole injection layer HIL, a hole transport layer HTL, a light emitting material layer EML, an electron transport layer, ETL, and an electron injection layer EIL. However, the present disclosure is not limited thereto. For example, two or more organic compound layers emitting different colors may be stacked according to a tandem structure. When current flows in the first light-emitting layer OLED1 or the second light-emitting layer OLED2, holes passing through the hole transport layer HTL and electrons passing through the electron transport layer ETL move to the first light-emitting layer OLED1 or the second light-emitting layer OLED2 where excitons may be generated. As a result, either the first light-emitting layer OLED1 or the second light-emitting layer OLED2 may emit visible light.

The driving transistor Tdr controls the current flowing through the first light-emitting layer OLED1 or the second light-emitting layer OLED2 according to voltage Vgs between the gate and the source thereof. A gate electrode of the driving transistor Tdr may be connected to a node P2, one of the first and second electrodes thereof may be connected to a first power line for supplying high-potential power voltage ELVDD, and the other thereof may be connected to a node P3. A source electrode thereof may be connected to the first power line and a drain electrode thereof may be connected to the node P3. Otherwise, the drain electrode thereof may be connected to the first power line and the source electrode thereof may be connected to the node P3. Voltage Vgs between the gate and the source of the driving transistor Tdr may be voltage as applied across the nodes P2 and P3.

The compensation circuit is configured for sampling the voltage Vgs between the gate and the source of the driving transistor Tdr in order to compensate for threshold voltage change of the driving transistor Tdr, and may include first to seventh switch transistors T1 to T7 and a storage capacitor Cst. Remaining elements except for the first switch transistor T1 to apply data voltage Vdata of a data line 14 among the first to seventh switch transistors T1 to T7 and the storage capacitor Cst may constitute the compensation circuit.

The first switch transistor T1 may be connected to and disposed between the data line Data and the node P1, and may be switched based on a first scan signal SCAN1. a gate electrode of the first switch transistor T1 may be connected to a first gate line 15a to which the first scan signal SCAN1 is applied. One of first and second electrodes thereof may be connected to the data line 14 and the other thereof may be connected to the node P1.

The second switch transistor T2 may be connected to and disposed between node P2 and node P3, and may be switched based on a second scan signal SCAN2. A gate electrode of the second switch transistor T2 may be connected to a second gate line 15b to which the second scan signal SCAN2 is applied. One of first and second electrodes thereof may be connected to the node P3 and the other thereof may be connected to the node P2.

Because one electrode of the second switch transistor T2 may be connected to the gate electrode of the driving transistor Tdr, off-current characteristic of the second switch transistor T2 should be good. Therefore, the second switch transistor T2 may be designed to have a dual gate structure to suppress leakage current when being turned off.

In the dual gate structure, a first gate electrode and a second gate electrode are connected to each other so as to have the same potential, and a channel length is larger than that of a single gate structure. As the channel length increases, resistance increases and the leakage current decreases during the turn-off, thereby ensuring stability of the operation. However, the second switch transistor T2 may be implemented to have a single gate structure. In this case, the second switch transistor T2 may be implemented as an oxide TFT.

The third switch transistor T3 may be connected to and disposed between the node P1 and a reference line to which reference voltage Vref is applied, and may be switched based on a light-emitting signal EM1. A gate electrode of the third switch transistor T3 may be connected to a third gate line 15c to which the light-emitting signal EM1 is applied. One of first and second electrodes thereof may be connected to the node P1 and the other thereof may be connected to the reference line.

The fourth switch transistor T4 may act as a first light-emission control thin-film transistor T4 that switches a light-emitting operation of the first light-emitting diode OLED1 disposed in the wide-angle area WAA.

The fourth switch transistor T4 may be connected to and disposed between a node P6 connected to the driving transistor Tdr and an anode electrode of the first light-emitting diode OLED1, and may be switched based on a first light-emitting control signal EM2. A gate electrode of the fourth switch transistor T4 may be connected to a first light-emission control signal application line EM2 to which the first light-emitting control signal EM2 is applied. One of first and second electrodes thereof may be connected to the node P6 and the other thereof may be connected to an anode electrode of the first light-emitting diode OLED1.

The fifth switch transistor T5 may be connected to and disposed between the reference line and a node P8 as a connection point between the fourth switch transistor T4 and the first light-emitting diode OLED1, and may be switched based on a second scan signal SCAN2. A gate electrode of the fifth switch transistor T5 may be connected to the second gate line 15b to which the second scan signal SCAN2 is applied. One of first and second electrodes thereof may be connected to a node P8 and the other thereof may be connected to the reference line.

The sixth switch transistor T6 acts as a second light-emission control thin-film transistor T6 that switches a light-emitting operation of the second light-emitting diode OLED2 disposed in the narrow-angle area NAA.

The sixth switch transistor T6 may be connected to and disposed between the node P6 connected to the driving transistor Tdr and an anode electrode of the second light-emitting diode OLED2, and may be switched based on the second light-emitting control signal EM3. A gate electrode of the sixth switch transistor T6 may be connected to a second light-emission control signal application line EM3 to which the second light-emitting control signal EM3 is applied. One of first and second electrodes thereof may be connected to the node P6 and the other thereof may be connected to the anode electrode of the second light-emitting diode OLED2.

The seventh switch transistor T7 may be connected to and disposed between a node P9 as a connection point between the sixth switch transistor T6 and the second light-emitting diode OLED2 and the reference line, and may be switched based on the second scan signal SCAN2. A gate electrode of the seventh switch transistor T7 may be connected to the second gate line 15b to which the second scan signal SCAN2 is applied. One of first and second electrodes thereof may be connected to the node P9 and the other thereof may be connected to the reference line.

The storage capacitor Cst may be connected to and disposed between the node P1 and the node P2.

Referring to FIG. 13, each pixel PXL may operate in an initialization period Initial, a sensing and initialization period Sensing & Initial, a holding period th, and a light-emitting period Emission. In this connection, the sensing and initialization period may be referred to as a 'programming period'.

In the initialization period Initial, the second scan signal SCAN2 and the light-emitting signal EM1 may be input as gate low voltage VGL as a turn-on level. The first scan signal SCAN1 may be input as a gate high voltage VGH as a turn-off level.

Further, in the initialization period Initial, the first light-emission control signal EM2 may be input as a gate low voltage VGL as a turn-on level. The second light-emission control signal EM3 may be input as a gate high voltage VGH as a turn-off level.

In the sensing and initialization period Sensing & Initial, each of the first and second scan signals SCAN1 and SCAN2 may be input as a gate low voltage VGL as a turn-on level. The light-emitting signal EM1 may be input as a gate high voltage VGH as a turn-off level.

Further, in the sensing and initialization period Sensing & Initial, each of the first light-emission control signal EM2 and the second light-emission control signal EM3 may be input as a gate high voltage VGH as a turn-off level.

In the holding period th, each of the first and second scan signals SCAN1, and SCAN2 and the light-emitting signal EM1 may be input as a gate high voltage VGH as a turn-off level. Each of the first light-emission control signal EM2 and the second light-emission control signal EM3 may maintain a gate high voltage VGH state.

In light-emission period Emission, each of the first and second scan signals SCAN1 and SCAN2 may be input as a gate high voltage VGH as a turn-off level. The light-emitting signal EM1 may be input as a gate low voltage VGL as a turn-on level.

Further, in the light-emitting period Emission, the first light-emission control signal EM2 may be input as a gate low voltage VGL as a turn-on level. The second light-emission control signal EM3 may be input as a gate high voltage VGH as a turn-off level.

Accordingly, the first light-emission control thin-film transistor T4 may be turned on, and the second light-emission control thin-film transistor T6 may be turned off. That is, while the first light-emission control thin-film transistor T4 disposed in the wide-angle area WAA is turned on, the second light-emission control thin-film transistor T6 disposed in the narrow-angle area NAA may be turned off.

The initialization period Initial, the sensing and initialization period Sensing & Initial, and the holding period th may be completed within 1 horizontal period 1H. The 1 horizontal period 1H may be a time duration allotted for initialization, programming and holding operations of a display line.

In FIG. 13, the initialization period Initial may be set to be equal to or shorter than 1 horizontal period 1H. The sensing and initialization period Sensing & Initial may be set to be equal to or shorter than 1 horizontal period 1H. In this case, the first scan signal SCAN1 may be set to be equal to or shorter than 2 horizontal periods. Further, in FIG. 13, the holding period th may be set to be equal to or shorter than 1 horizontal period.

In the initialization period Initial, the second and fifth switch transistors T2 and T5 may be turned on in response to the second scan signal SCAN2 of a turn-on level ON. In response to the light-emitting signal EM1 of a turn-on level ON, the third switch transistor T3 may be turned on. The fourth switch transistor T4 may be turned on in response to the first light-emission control signal EM2 of a turn-on level ON. As a result, all of the nodes P1, P2, P3, and P6 may be initialized to the reference voltage Vref. This initialization operation is intended to reset potentials of the nodes P1, P2, P3, and P6 to a constant value prior to the programming operation to increase reliability of internal compensation.

The reference voltage Vref is set to be closer to the low-potential power voltage VSS such that the reference voltage Vref is lower than the high-potential power voltage EVDD and is lower than an operation-point voltage Voled of each of the first light-emitting diode OLED1 and the second light-emitting diode OLED2. Therefore, in the initialization period Initial, the first light-emitting diode OLED1 and the second light-emitting diode OLED2 do not emit light.

In the programming period, that is, the sensing and initialization period Sensing & Initial, the second scan signal SCAN2 maintains the turn-on level and the first scan signal SCAN1 also changes to a turn-on level, so that the first, second and fifth switch transistors T1, T2, and T5 are turned on, and the light-emitting signal EM1 and the first light-emission control signal EM2 are inverted to a turn-off level, such that the third and fourth switch transistors T3 and T4 are turned off.

Because voltage ELVDD-Vref as the gate-source voltage Vgs of the driving transistor Tdr set in the initialization period Initial is greater than the threshold voltage Vth of the driving transistor Tdr, driving current flows through the driving transistor Tdr in the programming period, that is, the sensing and initialization period Sensing & Initial. In this connection, the gate electrode and the drain electrode of the driving transistor Tdr may be connected to each other due to the turned-on state of the second switch transistor T2, so that the driving transistor Tdr may be diode disconnected, and the driving current flows along a diode disconnection path due to the turned-off state of the fourth switch transistor T4. The threshold voltage Vth of the driving transistor Tdr may be sampled based on the driving current flowing along the diode disconnection path and may be stored in the nodes P2 and P3.

In the programming period, that is, the sensing and initialization period Sensing & Initialization, the current flow between the node P1 and the reference line may be disabled due to the turned off state of the third switch transistor T3. Then, the data voltage Vdata output to the data line 14 is applied to the node P1 due to the turned-on state of the first switch transistor T1.

In the programming period, that is, the sensing and initialization period Sensing & Initial, the reference voltage Vref may be continuously applied to the node P8 due to the turned-on state of the fifth switch transistor T5, and the OLED does not emit light.

In the programming period Sensing & Initial, the potential of the node P1 may be set to the data voltage Vdata, and the potentials of the node P2 and the node P3 may be set to ELVDD−|Vth|, and the potential of the node P8 may be set to the reference voltage Vref.

In the holding period th, the first and second scan signals SCAN1 and SCAN2 may be inverted from a turn-on level to a turn-off level, such that the first, second and fifth switch transistors T1, T2, and T5 are turned off. In addition, each of the light-emitting signal EM1 and the first light-emission control signal EM2 maintains the turn-off level, so that each of the third and fourth switch transistors T3 and T4 maintain the turned-off state. In the holding period th, due to the turned-off state of the first to fifth switch transistors T1 to T5, all of the first to third nodes P1, P2, and P3, and the eighth node P8 are in a floated state.

The holding period th is intended to allow an inverting timing when the first and second scan signals SCAN1 and SCAN2 change from a turn-on level to a turn-off level to precede an inverting timing when the light-emitting signal EM1 changes from a turn-off level to a turn-on level, thereby increasing stability of the operation. When the inverting timing related to the first and second scan signals SCAN1 and SCAN2 and the inverting timing related to the light-emitting signal EM1 coincide with each other, or the inverting timing related to the first and second scan signals SCAN1 and SCAN2 is later than the inverting timing related to the light-emitting signal EM1, the sampling operation of the threshold voltage becomes unstable. Thus, the holding period th is prepared to prevent this problem. However, the holding period th may be omitted.

In the light-emission period Emission, the first and second scan signals SCAN1 and SCAN2 maintain the turn-off level so that the first, second and fifth switch transistors T1, T2, and T5 may be continuously turned off. The light-emitting signal EM1 and the first light-emission control signal EM2 are inverted to a turn-on level, such that the third and fourth switch transistors T3 and T4 are turned on.

In light-emission period Emission, the reference voltage Vref is applied to the node P1 due to the turned-on state of the third switch transistor T3, such that the potential of the node P1 is lowered from the data voltage Vdata to the reference voltage Vref.

In the light-emission period Emission, the node P2 floats and is coupled to the node P1 through the storage capacitor Cst. Thus, the potential change Vdata-Vref of the node P1 during the light-emitting period Emission may be applied to the node P2. As a result, during the light-emitting period Emission, the potential of the node P2 is lowered by Vdata-Vref compared to EVDD−|Vth| thereof in the previous holding period th. In other words, during the light-emitting period Emission, the potential of the node P2 becomes (EVDD−|Vth|−Vdata+Vref).

Thus, the gate-source voltage Vgs of the driving transistor Tdr capable of compensating for the change in the threshold voltage Vth of the driving transistor Tdr may be set. A driving current Ioled corresponding to the gate-source voltage Vgs as expressed in a following Equation 1 flows through the driving transistor Tdr.

The driving current Ioled may allow the potential of each of the nodes P3 and P8 to increase to the operation-point voltage Voled of the first light-emitting diode OLED1, so that the first light-emitting diode OLED1 is turned on. As a result, the first light-emitting diode OLED1 emits light based on the driving current Ioled.

$$Ioled = K(Vgs - |Vth|)^2 \quad \text{Equation 1}$$
$$K(EVDD - \{EVDD - |Vth| - Vdata + Vref\} - |Vth|)^2$$
$$K(Vdata - Vref)^2$$

where K denotes a constant value determined based on mobility, a channel ratio, and parasitic capacitance of the driving transistor Tdr, and Vth denotes the threshold voltage of the driving transistor Tdr.

As may be identified from the above Equation 1, the driving current Ioled of the first light-emitting diode OLED1 is not affected with the high-potential power voltage ELVDD as well as the threshold voltage Vth of the driving transistor Tdr.

In the present disclosure, the scan signals used for pixel initialization and threshold voltage sensing are supplied to neighboring display lines in an overlapping manner with each other for a certain period. To this end, a gate driver circuit which may create the scan signals that overlaps each other using a small number of clocks and a simple circuit configuration may be proposed FIG. 14 shows an arrangement diagram of the first and second light-emission control signal application lines according to an embodiment of the present disclosure.

Figure 14:
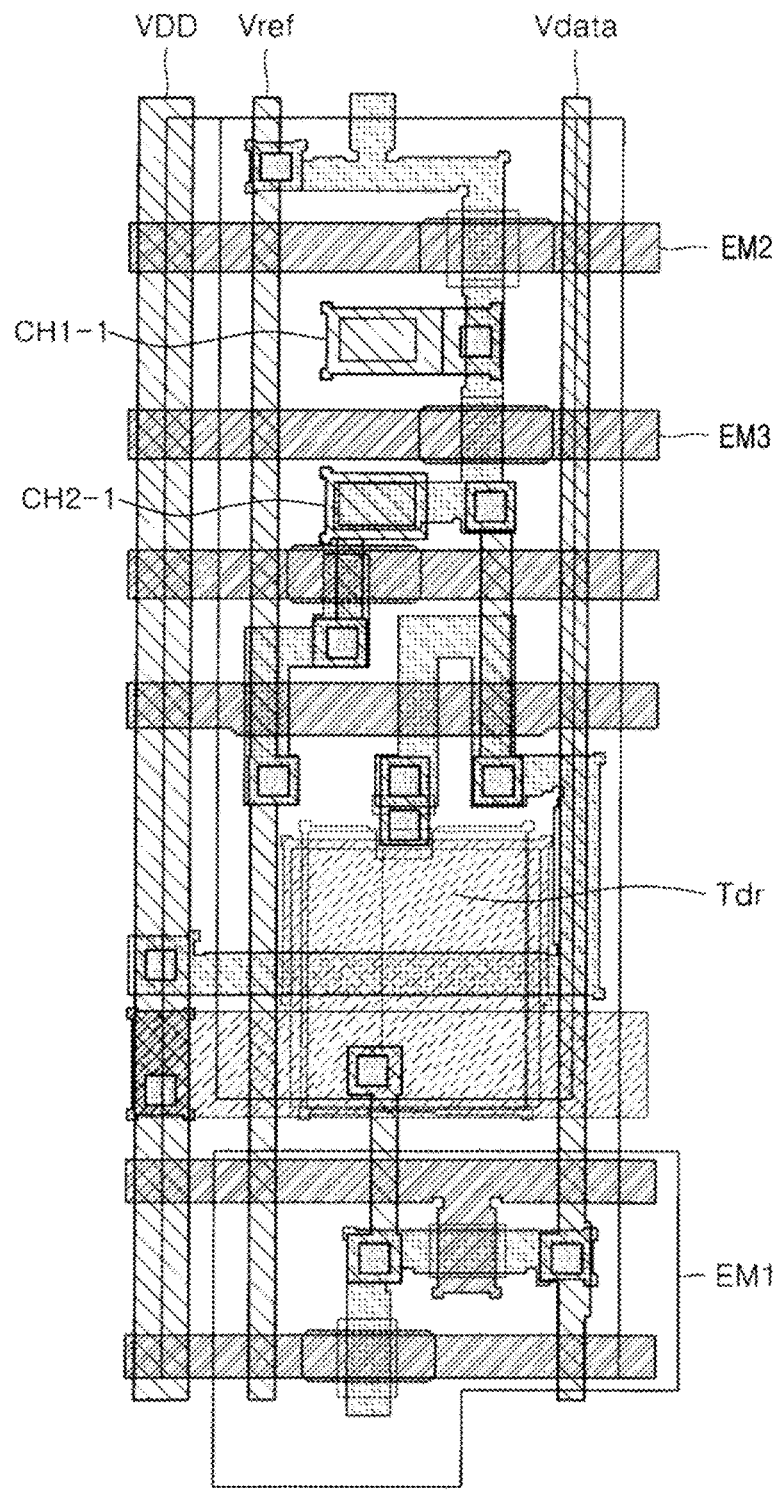
FIG. 14 shows an arrangement diagram of first and second light-emission control signal application lines according to an embodiment of the present disclosure.

Referring to FIG. 14, in the unit pixel 110 of the display panel 10 according to an embodiment of the present disclosure, the first light-emission control signal application line EM2 connected to the first light-emitting diode OLED1 disposed in the wide-angle area WAA may be spaced from the second light-emission control signal application line EM3 connected to the second light-emitting diode OLED2 disposed in the narrow-angle area NAA.

In FIG. 14, the high-potential power voltage application line VDD, the reference voltage application line Vref, and the data voltage application line Vdata may extend in a vertical direction in a plan view and may be spaced apart from each other by a constant spacing in a horizontal direction in a plan view.

The first light-emission control signal application line EM2 and the second light-emission control signal application line EM3 may intersect the high-potential power voltage application line VDD, the reference voltage application line Vref and the data voltage application line Vdata, and may extend in the horizontal (left-right) direction and may be spaced apart from each other by a constant spacing in the vertical direction.

In a plan view, the reference voltage application line Vref may be disposed on one side (left side) of the driving transistor Tdr, while the data voltage application line Vdata may be disposed on the opposite side (right side) of the driving transistor Tdr.

The light emission signal application line EM1 may intersect the reference voltage application line Vref and the data voltage application line Vdata, and may extend in the horizontal (left-right) direction.

The light emission signal application line EM1 is conventionally connected to both the gate electrodes of the third and fourth switch transistors T3 and T4 at the same time.

However, in an embodiment of the present disclosure, the light emission signal application line EM1 may be connected only to the gate electrode of the third switch transistor T3. A separate first light-emission control signal application line EM2 may be connected to the gate electrode of the fourth switch transistor T4.

The first light-emission control signal application line EM2 may be connected to the gate electrode of the first light-emission control thin-film transistor T4 connected to the first light-emitting diode OLED1 disposed in the wide-angle area WAA. In this connection, the first anode electrode AE1-1 of the first light-emitting diode OLED1 may be electrically connected to the gate electrode of the first light-emission control thin-film transistor T4 via a first-first contact-hole CH1-1.

The second light-emission control signal application line EM3 may be connected to the gate electrode of the second light-emission control thin-film transistor T6 connected to the second light-emitting diode OLED2 disposed in the narrow-angle area NAA. In this connection, the second anode electrode AE2-1 of the second light-emitting diode OLED2 may be electrically connected to the gate electrode of the second light-emission control thin-film transistor T6 via a second-first contact-hole CH2-1.

Therefore, the first light-emitting diode OLED1 disposed in the wide-angle area WAA and the second light-emitting diode OLED2 disposed in the narrow-angle area NAA perform light-emitting operations at different times. Thus, in order to control these different switching operations, the first light-emission control signal application line EM2 and the second light-emission control signal application line EM3 are spaced from each other.

As described above, the first light-emission control thin-film transistor T4 may be connected to the first light-emission control signal application line EM2. The first light-emitting diode OLED1 may be electrically connected to the first light-emission control thin-film transistor T4 via the first-first contact-hole CH1-1. The second light-emission control thin-film transistor T6 may be connected to the second light-emission control signal application line EM3. The second light-emitting diode OLED2 may be electrically connected to the second light-emission control thin-film transistor T6 via the second-first contact-hole CH2-1.

Accordingly, the timing controller 40 may apply the first light-emission control signal to the first light-emission control signal application line EM2 to turn on the first light-emission control thin-film transistor T4 and may not apply the second light-emission control signal to the second light-emission control signal application line EM3 while the first light-emission control thin-film transistor T4 is turned on.

Further, the timing controller 40 may apply the second light-emission control signal to the second light-emission control signal application line EM3 to turn on the second light-emission control thin-film transistor T6 and may not apply the first light-emission control signal to the first light-emission control signal application line EM2 while the second light-emission control thin-film transistor T6 is turned on.

As described above, according to the present disclosure, the plurality of pixels arranged in the light-emitting area may be arranged in each of the wide-angle area and the narrow-angle area of the unit pixel and may be individually activated in the wide-angle area and the narrow-angle area. Thus, the light-emitting angle of the pixels in the unit pixel may be selected to control the viewing angle of the display panel.

Further, according to the present disclosure, the refractive index of each of the lens divided into the wide-angle area and the lens disposed in the narrow-angle area may be adjusted to control the direction of light emitting from each light-emitting layer in each of the wide-angle area and the narrow-angle area. Thus, the viewing angle may be adjusted using the controlled light direction.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel comprising:
a unit pixel divided into a wide-angle area and a narrow-angle area, wherein at least one sub-pixel is disposed in each of the wide-angle area and the narrow-angle area;
a first lens disposed in the wide-angle area; and
a second lens disposed in the narrow-angle area;
wherein the at least one sub-pixel includes:
a first anode electrode layer in the wide-angle area and a second anode electrode layer in the narrow-angle area;
a first light-emitting layer and a second light-emitting layer respectively disposed on the first anode electrode layer and the second anode electrode layer;
a cathode electrode layer disposed on both the first light-emitting layer and the second light-emitting layer;
a first shielding layer having an opening defined therein and disposed on the cathode electrode layer;
a first insulating layer disposed on the first shielding layer;
a second shielding layer having an opening defined therein and disposed on the first insulating layer;
a first gap-fill layer disposed on the second shielding layer;
the first lens disposed on the first gap-fill layer in the wide-angle area;
the second lens disposed on the first gap-fill layer in the narrow-angle area; and
a second gap-fill layer disposed on both the first lens and the second lens,
wherein the opening of the first shielding layer and the opening of the second shielding layer are respectively defined in an area overlapping the first anode electrode layer and an area overlapping the second anode electrode layer.

2. The display panel of claim 1, wherein the first lens is a semi-cylindrical lens, and the second lens is a semi-spherical lens.

3. The display panel of claim 1, wherein the at least one sub-pixel includes a plurality of sub-sub-pixels.

4. The display panel of claim 3, wherein the second lens includes a plurality of second lenses arranged in the narrow-angle area and respectively formed on the plurality of sub-sub-pixels.

5. The display panel of claim 4, wherein each second lens has a bottom face having an area larger than a light-emitting area of each sub-sub-pixel.

6. The display panel of claim 1, wherein the first lens includes at least two or more first lenses arranged in the wide-angle area and having the same shape and the same size as each other.

7. The display panel of claim 1, wherein the unit pixel includes at least three sub-pixels, wherein in the wide-angle area, the first lens cover on at least two sub-pixels.

8. The display panel of claim 7, wherein each of the at least three sub-pixels includes a plurality of sub-sub-pixels, wherein the at least three sub-pixels include a first sub-pixel, a second sub-pixel, and a third sub-pixel that emit different colors,
wherein a number of a plurality of sub-sub-pixels of the third sub-pixel is larger than each of a number of a plurality of sub-sub-pixels of the first sub-pixel and a number of a plurality of sub-sub-pixels of the second sub-pixel.

9. The display panel of claim 1, wherein the second lens includes at least two or more second lenses arranged in the narrow-angle area and having the same shape, the same size, and the same thickness as each other.

10. The display panel of claim 1, wherein the first lens and the second lens have different shapes and different sizes.

11. The display panel of claim 1, wherein a size of each of the at least one sub-pixel, the first lens and the second lens varies based on a light output cut-off angle.

12. The display panel of claim 1, wherein a size of each of the at least one sub-pixel, the first lens and the second lens varies based on light efficiency and light concentration of the at least one sub-pixel.

13. The display panel of claim 1, wherein the opening of the first shielding layer and the opening of the second shielding layer have the same size and the same thickness.

14. The display panel of claim 1, wherein the at least one sub-pixel includes:
a first transistor connected to a data line;
a driving transistor connected to driving power;
a fourth transistor disposed between and connected to the driving transistor and the first anode electrode layer and switchable based on a first light-emitting control signal; and
a sixth transistor disposed between and connected to the driving transistor and the second anode electrode layer and switchable based on a second light-emitting control signal.

15. The display panel of claim 1, wherein a spacing between the first light-emitting layer and the first lens is adjusted based on a thickness of the first gap-fill layer,
wherein a spacing between the second light-emitting layer and the second lens is adjusted based on the thickness of the first gap-fill layer.

16. The display panel of claim 1, wherein the first gap-fill layer is made of one selected from acrylic, epoxy, silicon, or combinations thereof.

17. The display panel of claim 1, wherein the first gap-fill layer is made of an organic material.

18. A display device comprising:
a display panel including:
a unit pixel divided into a wide-angle area and a narrow-angle area, wherein at least one sub-pixel is disposed in each of the wide-angle area and the narrow-angle area;
a first lens disposed in the wide-angle area; and
a second lens disposed in the narrow-angle area;
a gate driver for applying a gate signal to the at least one sub-pixel in each of the wide-angle area and the narrow-angle area through at least one gate line;
a data driver for applying a data signal to the at least one sub-pixel in each of the wide-angle area and the narrow-angle area through at least one data line; and
a timing controller for controlling the gate driver and the data driver;
wherein the at least one sub-pixel includes:
a first anode electrode layer in the wide-angle area and a second anode electrode layer in the narrow-angle area;
a first light-emitting layer and a second light-emitting layer respectively disposed on the first anode electrode layer and the second anode electrode layer;
a cathode electrode layer disposed on both the first light-emitting layer and the second light-emitting layer;
a first shielding layer having an opening defined therein and disposed on the cathode electrode layer;
a first insulating layer disposed on the first shielding layer;
a second shielding layer having an opening defined therein and disposed on the first insulating layer;
a first gap-fill layer disposed on the second shielding layer;
the first lens disposed on the first gap-fill layer in the wide-angle area;
the second lens disposed on the first gap-fill layer in the narrow-angle area; and
a second gap-fill layer disposed on both the first lens and the second lens,
wherein the opening of the first shielding layer and the opening of the second shielding layer are respectively defined in an area overlapping the first anode electrode layer and an area overlapping the second anode electrode layer.

19. The display device of claim 18, wherein the device further comprises:
a first light-emission control signal application line connected to the at least one sub-pixel disposed in the wide-angle area; and
a second light-emission control signal application line connected to the at least one sub-pixel disposed in the narrow-angle area,
wherein the first and second light-emission control signal application lines are spaced from each other.

20. The display device of claim 19, wherein a first light-emission control thin-film transistor is connected to the first light-emission control signal application line,
wherein a first light-emitting diode is electrically connected to the first light-emission control thin-film transistor via a first contact-hole,
wherein a second light-emission control thin-film transistor is connected to the second light-emission control signal application line,
wherein a second light-emitting diode is electrically connected to the second light-emission control thin-film transistor via a second contact-hole.

21. The display device of claim 20, wherein the timing controller is configured:
to apply a first light-emission control signal to the first light-emission control signal application line to turn on the first light-emission control thin-film transistor; and
not to apply a second light-emission control signal to the second light-emission control signal application line while the first light-emission control thin-film transistor is turned on.

22. The display device of claim 20, wherein the timing controller is configured:

to apply a second light-emission control signal to the second light-emission control signal application line to turn on the second light-emission control thin-film transistor; and not to apply a first light-emission control signal to the first light-emission control signal application line while the second light-emission control thin-film transistor is turned on.

* * * * *